(12) United States Patent
Choi et al.

(10) Patent No.: US 12,225,754 B2
(45) Date of Patent: Feb. 11, 2025

(54) DISPLAY DEVICE

(71) Applicant: Samsung Display Co., LTD., Yongin-si (KR)

(72) Inventors: Nak Cho Choi, Yongin-si (KR); Dong Hyun Son, Seoul (KR); Se Wan Son, Hwaseong-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 685 days.

(21) Appl. No.: 17/389,271

(22) Filed: Jul. 29, 2021

(65) Prior Publication Data
US 2022/0165984 A1    May 26, 2022

(30) Foreign Application Priority Data

Nov. 24, 2020 (KR) .................. 10-2020-0159102

(51) Int. Cl.
*H01L 51/52* (2006.01)
*H10K 50/844* (2023.01)
(Continued)

(52) U.S. Cl.
CPC ......... *H10K 50/844* (2023.02); *H10K 50/865* (2023.02); *H10K 59/122* (2023.02); *H10K 59/38* (2023.02)

(58) Field of Classification Search
CPC .. H10K 50/844; H10K 50/865; H10K 59/122; H10K 59/38; H10K 50/86; H10K 59/124; H10K 59/126; H10K 59/40; H10K 59/121; H10K 59/65; H10K 50/8426; H10K 59/00; H01L 27/156; H01L 25/18; H01L 33/44; H01L 33/52; H01L 33/58
See application file for complete search history.

(56) References Cited

U.S. PATENT DOCUMENTS

2021/0280658 A1    9/2021   Chae et al.
2021/0327971 A1   10/2021   Hyun et al.
(Continued)

FOREIGN PATENT DOCUMENTS

KR    1020200013819 A    2/2020
KR    1020200065185 A    6/2020
(Continued)

*Primary Examiner* — Cuong B Nguyen
(74) *Attorney, Agent, or Firm* — CANTOR COLBURN LLP

(57) ABSTRACT

A display device includes: a substrate on which a display area and a transmission area are defined; a metal blocking layer disposed in the display area on the substrate; an inorganic insulation layer disposed on the metal blocking layer; an organic insulation layer disposed on the inorganic insulation layer; a pixel defining layer disposed on the organic insulation layer, where an opening is defined through the pixel defining layer; an emission layer disposed on the organic insulation layer, and in the opening; a planarization layer disposed in the transmission area, on the organic insulation layer; and an encapsulation layer disposed in the display area and the transmission area. The inorganic insulation layer is at least partially removed in the transmission area, the organic insulation layer is disposed in the display area and the transmission area, and the planarization layer contacts a side surface of the pixel defining layer.

20 Claims, 23 Drawing Sheets

(51) Int. Cl.
  *H10K 50/86* (2023.01)
  *H10K 59/122* (2023.01)
  *H10K 59/38* (2023.01)

(56) References Cited

U.S. PATENT DOCUMENTS

| | | |
|---|---|---|
| 2021/0335955 A1 | 10/2021 | Son et al. |
| 2021/0359073 A1 | 11/2021 | Cha et al. |
| 2021/0375943 A1 | 12/2021 | Lee et al. |
| 2021/0391400 A1* | 12/2021 | Kim .................... H10K 59/126 |
| 2022/0059806 A1 | 2/2022 | Ko et al. |

FOREIGN PATENT DOCUMENTS

| | | |
|---|---|---|
| KR | 1020200102580 A | 9/2020 |
| KR | 1020210050058 A | 5/2021 |
| KR | 1020210052724 A | 5/2021 |
| KR | 1020210052757 A | 5/2021 |
| KR | 1020210059091 A | 5/2021 |
| KR | 1020210074447 A | 6/2021 |
| KR | 1020210086888 A | 7/2021 |
| KR | 1020210103632 | 8/2021 |
| KR | 1020210113511 | 9/2021 |
| KR | 1020210113537 | 9/2021 |
| KR | 1020210128554 | 10/2021 |
| KR | 1020210130893 | 11/2021 |
| KR | 1020210142033 | 11/2021 |
| KR | 1020210149958 | 12/2021 |
| KR | 1020220022947 | 3/2022 |

\* cited by examiner

DISPLAY DEVICE

This application claims priority to Korean Patent Application No. 10-2020-0159102, filed on Nov. 24, 2020, and all the benefits accruing therefrom under 35 U.S.C. § 119, the content of which in its entirety is herein incorporated by reference.

BACKGROUND

1. Field

The disclosure relates to a display device.

2. Description of the Related Art

A display device may include an optical device such as a sensor, a camera, or the like. The optical device may be disposed in a bezel region (a region surrounding a screen) of the display device to avoid interference with the screen.

When the bezel of the display device is reduced, the screen-to-body ratio of the display device, that is, the ratio of an area occupied by the screen with an entire area when the display device is viewed from a front or top, may be increased. The screen-to-body ratio reflects the technology level of the display device and at the same time plays an important role in the consumer's product selection.

As the bezel of the display device is reduced, the optical device may not be easily disposed in the bezel region, and accordingly, a technology for disposing the optical device in the screen is being developed.

SUMMARY

Embodiments have made an effort to provide a display device in which an optical device is disposed in the screen, and increasing performance of the optical device.

According to an embodiment of the invention, a display device includes: a substrate on which a display area and a transmission area are defined; a metal blocking layer disposed in the display area on the substrate; an inorganic insulation layer disposed on the metal blocking layer; an organic insulation layer disposed on the inorganic insulation layer; a pixel defining layer disposed on the organic insulation layer, where an opening is defined through the pixel defining layer; an emission layer disposed on the organic insulation layer, and is disposed in the opening of the pixel defining layer; a planarization layer disposed in the transmission area on the organic insulation layer; and an encapsulation layer disposed in the display area and the transmission area, where the inorganic insulation layer is at least partially removed in the transmission area, and the organic insulation layer is disposed in the display area and the transmission area, and the planarization layer contacts a side surface of the pixel defining layer.

In an embodiment, the display device may further include a spacer disposed on the pixel defining layer, and the planarization layer may be defined by a same layer as the spacer.

In an embodiment, the display device may further include a spacer disposed on the pixel defining layer, where the organic insulation layer may include a step portion disposed in the transmission area, the planarization layer may be disposed in the step portion, and the planarization layer may be defined by a same layer as the spacer.

In an embodiment, a difference in surface level of the planarization layer disposed below the encapsulation layer of the transmission area may be about 0.5 micrometer (μm) or less.

In an embodiment, the display device may further include a light blocking layer and a color filter, which are disposed on the emission layer of the display area, where an edge of the light blocking layer may protrude toward the transmission area more than an edge of the metal blocking layer.

In an embodiment, a first opening may be defined through the metal blocking layer to overlap the transmission area, a second opening may be defined through the light blocking layer to overlap the transmission area, and a planar area of the second opening may be smaller than a planar area of the first opening.

In an embodiment, a planar shape of the first opening and a planar shape of the second opening may be substantially the same as each other.

According to an embodiment of the invention, a display device includes: a first display area including a first pixel area; a second display area including a second pixel area and a transmission area which neighbor each other; an optical device which overlaps the second display area; a metal blocking layer disposed in the second pixel area; an inorganic insulation layer disposed in the first pixel area, the second pixel area, and an edge of the transmission area; an organic insulation layer disposed in the first display area and the second display area; a pixel defining layer disposed on the organic insulation layer; a planarization layer disposed in the transmission area, and is disposed on the organic insulation layer; and an encapsulation layer disposed in the first display area and the second display area, where the inorganic insulation layer covers an edge of the metal blocking layer, and the planarization layer contacts a side surface of the pixel defining layer In an embodiment, the light blocking layer and the color filter may be disposed on the encapsulation layer.

In embodiments of the display device according to the invention, the optical device may be disposed to overlap the screen while increasing the performance of the optical device.

DETAILED DESCRIPTION

Figure 1:
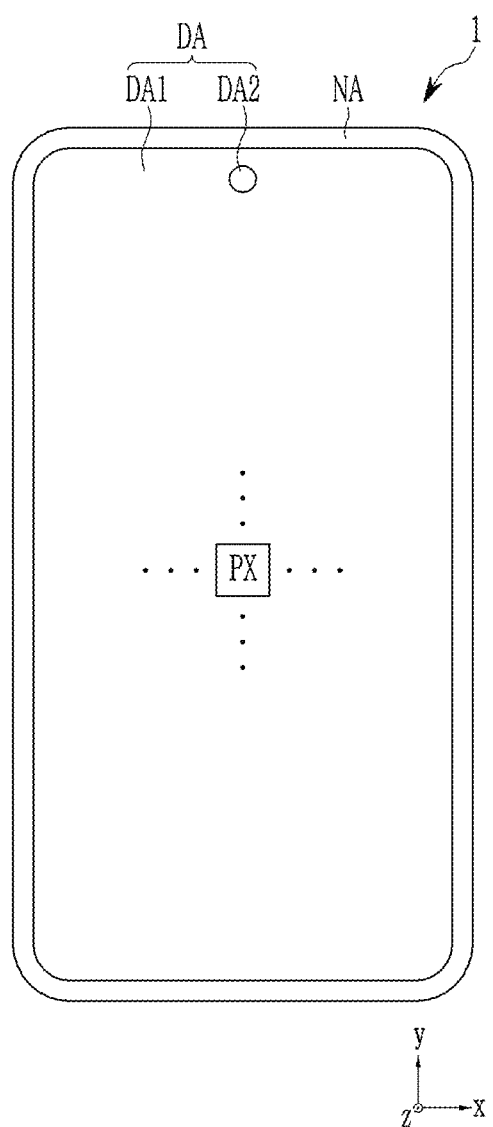
FIG. 1 is a schematic top plan view of a display device 1 according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

The drawings and description are to be regarded as illustrative in nature and not restrictive. Like reference numerals designate like elements throughout the specification.

In the drawings, size and thickness of each element are arbitrarily illustrated for convenience of description, and the invention is not necessarily limited to as illustrated in the drawings. In the drawings, the thickness of layers, films, panels, regions, etc., are exaggerated for clarity. In addition, in the drawings, for better understanding and ease of description, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, throughout the specification, the phrase "on a plane" means viewing a target portion from the top, and the phrase "on a cross-section" means viewing a cross-section formed by vertically cutting a target portion from the side.

In addition, when "connected to" in the entire specification, this does not only mean that two or more constituent elements are directly connected, but also means that two or more constituent elements are indirectly connected, physically connected, and electrically connected through other constituent elements, or being referred to by different names depending on the position or function, while being integral.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In drawing, the symbol x used to indicate the direction is the first direction, y is a second direction that is perpendicular to the first direction, and z is a third direction that is perpendicular to the first direction and the second direction.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
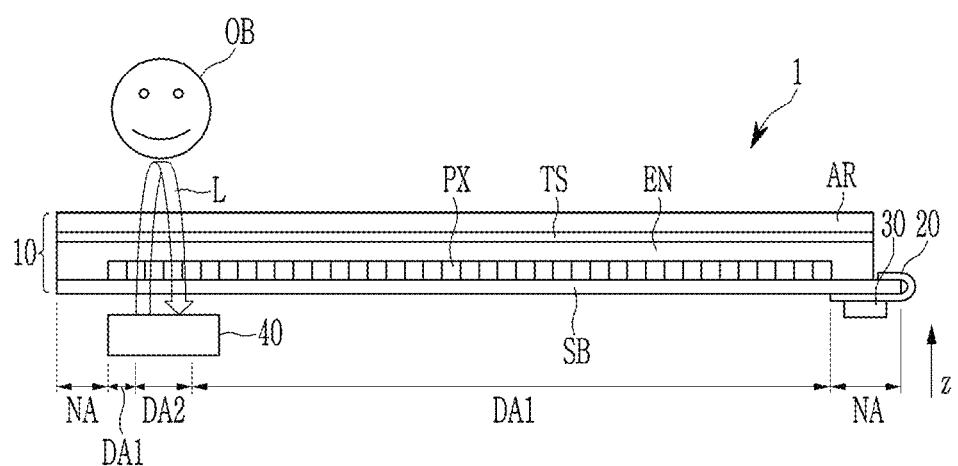
FIG. 2 is a schematic cross-sectional view of the display device 1 according to an embodiment.

Referring to FIG. 1 and FIG. 2, a display device according to an embodiment will be schematically described. FIG. 1 is a schematic top plan view of a display device 1 according to an embodiment, and FIG. 2 is a schematic cross-sectional view of the display device 1 according to an embodiment.

Referring to FIG. 1 and FIG. 2, an embodiment of a display device 1 may include a display device including a display panel 10, a flexible printed circuit film 20 connected to the display panel 10, an integrated circuit ("IC") chip 30, and the like, and an optical device 40.

The display panel 10 may include a display area DA where an image is displayed, and a non-display area NA that is disposed to surround the display area DA and where no image is displayed. The display area DA may correspond to a screen. The display panel 10 displays an image and detects a touch input thereon.

In an embodiment, a plurality of pixels PX is disposed in the display area DA. Here, the pixel PX is the minimum unit for displaying an image, and each pixel PX may display a specific color, for example, red, green, and blue, with various luminances based on an input video signal.

In the non-display area NA, circuits and/or signal lines for generating and/or transmitting various signals applied to the display area DA are disposed. Signal lines such as a gate line, a data line, a driving voltage line, and the like are connected to the respective pixels PX, and the pixels PX may receive a gate signal, a data voltage, a driving voltage, and the like through the signal lines.

The display area DA includes a first display area DA1 and a second display area DA. The second display area DA2 has higher transmittance than the first display area DA1 so that the second display area DA2 may perform other functions besides a function of displaying an image. Here, the transmittance means transmittance of light passing through the display panel 10 in a third direction z. The light may be visible light and/or light with a wavelength other than visible light (e.g., infrared light). The second display area DA2 has a smaller pixel PX density than the first display area DA1, that is, the number of pixels PXs per unit area in the second display area DA2 is smaller than that in the first display area DA1

In an embodiment of the display area DA, a position of the second display area DA2 may be variously modified. In an embodiment, as shown in FIG. 1, the second display area DA2 is disposed in the first display area DA1 and is surrounded by the first display area DA1.

The second display area DA2 may be disposed while being adjacent to the non-display area NA, and for example, may be divided into two or more regions on the left, right, and/or center of the display area DA. The second display area DA2 may be disposed along a first direction x completely across the top of the display area DA, or may be disposed along a second direction y across the left and/or right ends of the display area DA. The second display area DA2 may have one of various shapes such as polygons such as a quadrangle and a triangle, circles, and ellipses.

A driving unit that generates and/or processes various signals for driving the display panel 10 may be disposed in the non-display area NA. The driving unit may include a data driver for applying a data voltage to data lines, a gate driver for applying a gate signal to gate lines, and a signal controller for controlling the data driver and the gate driver.

The drivers may be integrated with the display panel 10, and may be disposed in the left and right sides or one side of the display area DA. The data driver and the signal controller may be provided as IC chips (also called driving IC chips) 30, and the IC chips 30 may be mounted to the flexible printed circuit film 20 and thus be electrically connected to the display panel 10. Alternatively, the IC chip 30 may be mounted to the non-display area NA of the display panel 10.

The display panel 10 may include a substrate SB, and a plurality of pixels PX may be disposed or formed on the substrate SB. The substrate SB may be positioned continuously over the first display area DA1 and the second display area DA2.

The display panel 10 may include an encapsulation layer EN that covers the entire pixels PX. The encapsulation layer EN seals the first display area DA1 and the second display area DA2 to prevent permeation of moisture and oxygen into the display panel 10.

A touch sensor layer TS may be disposed on the encapsulation layer EN. A region of the touch sensor layer TS, which may detect a touch thereon, may approximately match the display area DA.

Touch electrodes (not shown) may be disposed in the touch sensor layer TS. One touch electrode may be disposed over a plurality of pixels PX. The touch electrode may be in a shape of a metal mesh. The touch electrode may include or be formed of a metallic material such as titanium, aluminum, copper, molybdenum, and the like, or a transparent conductive material such as indium tin oxide ("ITO"), indium zinc oxide ("IZO"), and the like. The touch electrode may have a single layer structure or a multilayer structure.

The touch electrodes may detect contact or non-contact touch of a user. Each touch electrode may detect a touch in a self-capacitor method, or adjacent touch electrodes may detect a touch in a mutual capacitor method. The display panel 10 may be called a touch screen panel. The display device 1 may include a touch driver that generates signals for driving the touch electrodes and processes signals received from the touch electrodes, and the touch driver may be provided as an IC chip.

An anti-reflection layer AR may be disposed on the touch sensor layer TS to reduce reflection of external light. The anti-reflection layer AR may include a light blocking member and a color filter. The anti-reflection layer AR will be described in detail later.

The optical device 40 may be disposed in a rear side of the display panel 10 to overlap the display panel 10, may be disposed corresponding to the entire second display area DA2, or may be disposed corresponding to only a part of the second display area DA2. In an embodiment, a plurality of optical devices 40 may be disposed in the second display area DA2.

The optical device 40 may be a camera, a sensor, a flash, or the like. In an embodiment, where the optical device 40 is a sensor, the optical device 40 may be a proximity sensor or an illuminance sensor. Light of the wavelength used by the optical device 40 may pass through the display panel 10 with higher transmittance through the second display area DA2.

The optical device 40 may emit light L of a certain wavelength range toward an object OB positioned in front of the display panel 10 or receive light L reflected from the object OB. Light L of such a certain wavelength range may be light of a wavelength that may be processed by the optical device 40, the light L may be visible light and/or infrared light, and the light of a certain wavelength mainly passes through a transmission region positioned in the second display area DA2. In one embodiment, for example, where the optical device 40 uses infrared light, light of a certain wavelength may have a wavelength region of about 900 nanometers (nm) to 1000 nm. The optical device 40 may receive light of a certain wavelength radiated on the front of the display panel 10.

In an embodiment, various electronic devices may be disposed on the rear side of the display panel 10 in addition to the optical device 40.

Figure 3:
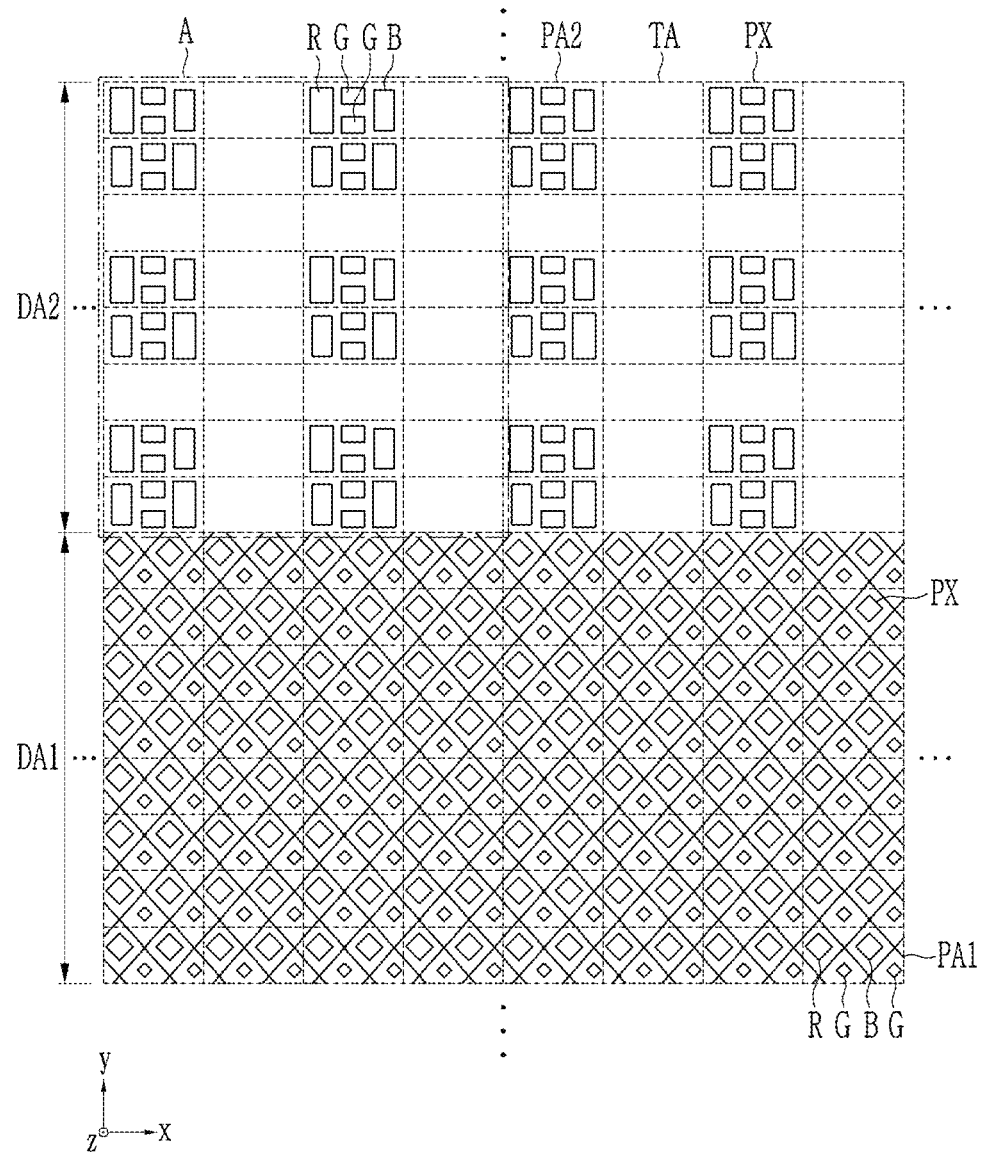
FIG. 3 is a schematic plan view of a first display area and a second display area of a display device according to an embodiment.

Referring to FIG. 3, together with FIG. 1 and FIG. 2, the first display area DA1 and the second display area DA2 of the display device 1 according to an embodiment will be described. FIG. 3 is a schematic plan view of a first display area and a second display area of a display device according to an embodiment.

Referring to FIG. 3, in an embodiment, the first display area DA1 includes a plurality of first pixel areas PA1, and the second display area DA2 includes a plurality of second pixel areas PA2 and a plurality of transmission area TA.

A size of one first pixel area PA1 and a size of one second pixel area PA2 may be different from each other, but are not limited thereto. Alternatively, the size of one first pixel area PA1 and the size of one second pixel area PA2 may be the same as each other.

Each of the pixel areas PA1 and PA2 may include at least one pixel PX. The pixel PX may include a pixel circuit and a light emitting portion. The pixel circuit is a circuit for driving a light emitting element such as a light emitting diode ("LED"), and may include a transistor, a capacitor, and the like. The light emitting part is a region in which light emitted from the light emitting device is emitted. In an embodiment, in the second display area DA2, the pixel circuit may be disposed in the non-display area, or may be located in a separate space disposed in the first display area DA1. The pixel circuit and the second pixel areas PA2 are connected with each other through a connection wire that includes or is formed of a transparent metal, and thus efficiency of the optical device may be improved.

The pixel PX shown in FIG. 3 may correspond to the light emitting portion. The light emitting portion may have one of various shapes such as a rhombus shape, a rectangular shape, and a circular shape. The pixel PX may emit light in one direction, that is, a third direction z.

The transmission area TA does not include the pixel circuit and the light emitting portion. The pixel circuit, the light emitting portion, the touch electrode, and the like, which interfere with light transmission, are not disposed in the transmission area TA, and thus the first pixel areas PA1 have higher transmittance than the second pixel areas PA2.

Wiring areas WA are disposed at the periphery of the second pixel areas PA2, and a plurality of signals for transmitting signals to the pixels may be disposed in the first pixel area PA1, the second pixel area PA2, and the wiring area WA.

According to an embodiment, as shown in FIG. 3, each of the first pixel areas PA1 includes one red pixel R, two green pixels G, and one blue pixel B. Each of the second pixel areas PA2 includes one red pixel R, two green pixels G, and one blue pixel B.

Arrangement of the red pixel R, the green pixel G, and the blue pixel B in first pixel area PA1 and arrangement of the red pixel R, the green pixel G, and the blue pixel B in the second pixel area PA2 may be different from each other, and the sizes of the red pixel R, the green pixel G, and the blue pixel B in the first pixel area PA1 and the sizes of the red pixel R, the green pixel G, and the blue pixel B in the second pixel area PA2 may be different from each other. Alternatively, the pixel arrangement of the first pixel area PA1 and the pixel arrangement of the second pixel area PA2 may be the same as each other.

In an embodiment, a set of pixels R, G, and B included in each of the pixel areas PA1 and PA2 may be called as a unit pixel. In such an embodiment, a unit pixel of the first pixel area PA1 and a unit pixel of the second pixel area PA2 may be the same as or different from each other in configuration. A unit pixel may include one red pixel R, one green pixel G, and one blue pixel B. Alternatively, the unit pixel may include at least one of the red pixel R, the green pixel G, and the blue pixel B, and may include a white pixel.

The pixels R, G, and B included in the first display area DA1 form a pixel row in the first direction x. In each pixel row in the first display area DA1, pixels R, G, and B are roughly arranged in a row in the first direction x. In each pixel row, the pixels R, G, and B may be repeatedly arranged in the order of a red pixel R, a green pixel G, a blue pixel B, and a green pixel G in the first direction x. The arrangement of the pixels R, G, and B included in one pixel row may be variously changed. In one alternative embodiment, for example, pixels R, G, and B may be repeatedly arranged in the order of the blue pixel B, the green pixel G, the red pixel R, and the green pixel G in the first direction x, or the pixels R, G, and B may be repeatedly arranged in the order of the red pixel R, the blue pixel B, the green pixel G, and the blue pixel B.

In each pixel row in the second display area DA2, pixels R, G, and B are roughly arranged in a row in the first direction x. In each pixel row, pixels R, G, and B may be repeatedly arranged in the first direction x with one red pixel R, two green pixels G, and one blue pixel B. The arrangement of pixels R, G, and B included in one pixel row may be variously changed. In the second display area DA2, each pixel PX may have a planar shape of a rectangular shape.

The plane size of the green pixel G may be smaller than the plane size of the red pixel R.

The pixels R, G, and B of the first and second pixel areas PA1 and PA2 also form a pixel column in the second direction y. In each pixel column, pixels R, G, and B are roughly arranged in a row in the second direction y. In each pixel column, pixels PX of the same color may be arranged, and pixels PX of two or more colors may be arranged alternately in the second direction y. The arrangement of pixels R, G, and B included in one pixel column may be variously changed.

The pixels R, G, and B of the second pixel area PA2 may be a cross-section emission type, for example, a front emission type that emits light in a third direction z. Alternatively, the pixels R, G, and B of the second pixel area PA2 may be of a bottom emission type or a double-sided emission type.

Figure 4:
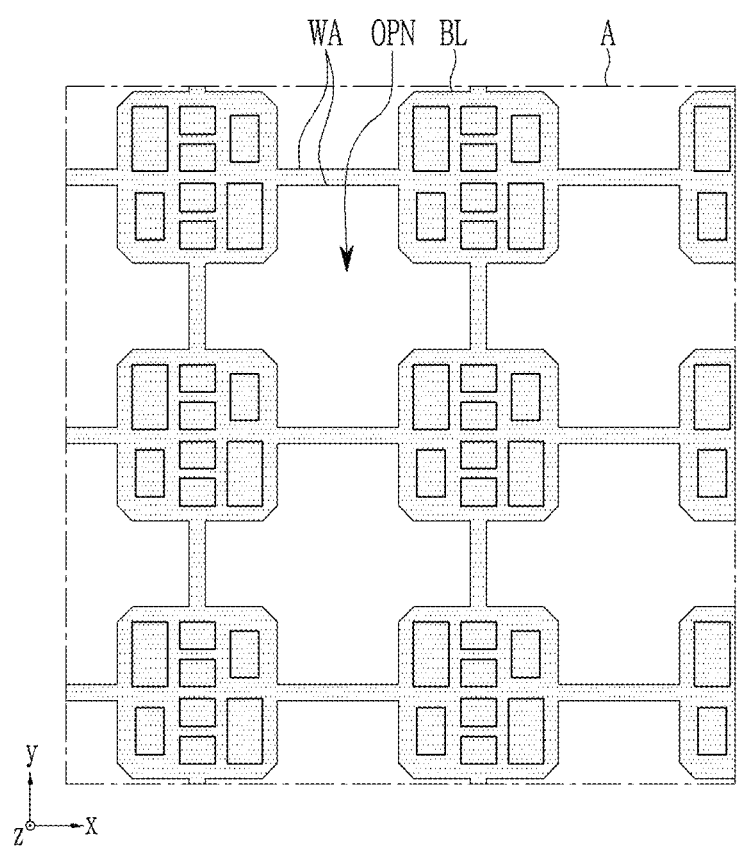
FIG. 4 is a schematic enlarged view of the second pixel area of the display device according to an embodiment.

Next, referring to FIG. 3 and FIG. 4, the second pixel area PA2 and the transmission area TA in the second display area DA2 will be described. FIG. 4 is a schematic enlarged view of the second pixel area of the display device according to the embodiment, which is an enlarged view of the area A in FIG. 3.

Referring to FIG. 4, together with FIG. 3, the second pixel area PA2 and the transmission area TA are adjacent to each other in the second display area DA2, and the second pixel area PA2 includes the pixels R, G, and B. The second display area DA2 further includes a plurality of wiring areas WA disposed between the plurality of second pixel areas PA2 and the plurality of transmission areas TA. The plurality of wiring areas WA are disposed to surround the plurality of transmission areas TA, respectively. Although it is not illustrated, signal lines such as a gate line, a data line, and the like for transmitting signals to the pixels R, G, and B in the second pixel area PA2 may be disposed in the wiring area WA located at boundaries of the transmission areas TA to prevent deterioration of the transmittance of the transmission area TA.

A metal blocking layer BL is disposed in the second pixel area PA2, and an opening OPN is defined through the metal blocking layer BL in the transmission area TA.

The metal blocking layer BL may include a metal, and prevents inflow of light from the outside into the second pixel area PA2, and prevents light passing through the transmission area TA from being diffracted around the transmission area TA. The metal blocking layer BL may include a metal oxide.

According to an embodiment, as shown in FIG. 4, the opening OPN of the metal blocking layer BL has an approximately cross-shaped plane shape, and a size of an upper protruding portion, a size of a lower protruding portion, a size of a left protruding portion, and a size of a right protruding portion of the cross-shaped opening OPN may be approximately the same as each other.

In such an embodiment, the opening OPN of the metal blocking layer BL is formed in an approximately cross shape of which the upper protruding portion, the lower protruding portion, the left protruding portion, and the right protruding portion are substantially the same as each other in size, thereby reducing light diffraction.

The metal blocking layer BL may also be disposed in the wiring area WA. The metal blocking layer BL is also disposed in the wiring area WA that is disposed to surround the transmission area TA, and thus prevents light passing through the transmission area TA from being reflected and diffracted around the transmission area TA, thereby preventing quality degradation of the optical device 40 due to peripheral light.

Figure 5:
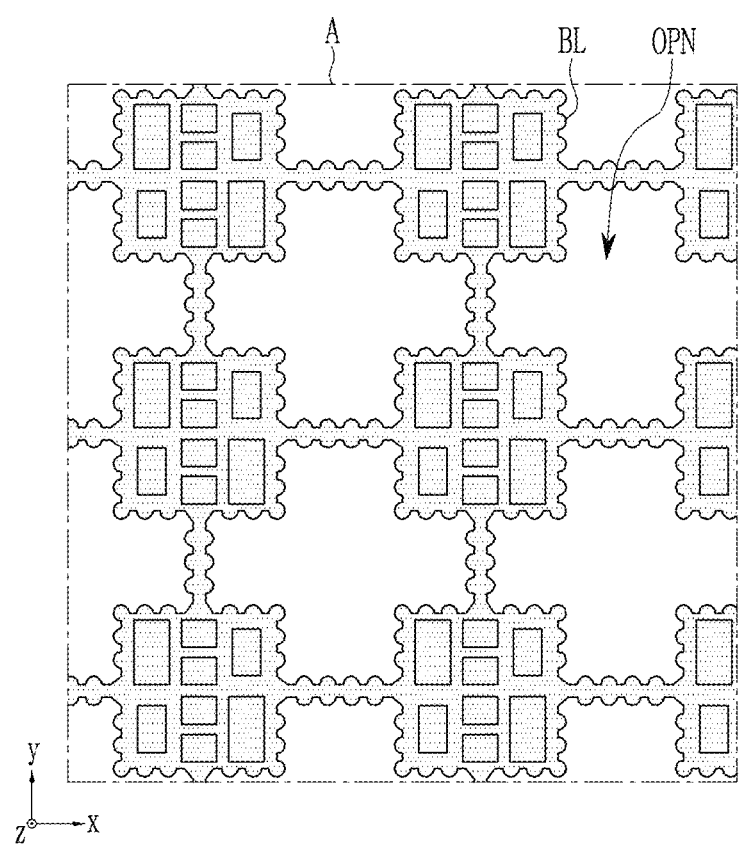
FIG. 5 is a schematic enlarged view of a second pixel area of a display device according to an alternative embodiment.

Next, referring to FIG. 5, together with FIG. 3, a second pixel area PA of a display device according to an alternative embodiment will be described. FIG. 5 is a schematic enlarged view of a second pixel area of a display device according to an alternative embodiment, and is an enlarged view of the area A in FIG. 3.

Referring to FIG. 3 and FIG. 5, in an embodiment, an opening OPN of a metal blocking layer BL of a second pixel area PA2 of a display device has an approximately cross-shaped plane shape, and a size of an upper protruding portion, a size of a lower protruding portion, a size of a left protruding portion, and a size of a right protruding portion of the cross-shaped opening OPN may be approximately the same as each other.

The opening OPN of the metal blocking layer BL is formed in an approximately cross shape of which the upper protruding portion, the lower protruding portion, the left protruding portion, and the right protruding portion are almost the same as each other in size, thereby reducing light diffraction.

The metal blocking layer BL is disposed to overlap a wiring area WA where signal lines for transmitting signals to the second pixel area PA2 are positioned, thereby preventing inflow of light to the signal lines disposed to the wiring area WA and light from being viewed from the transmission area TA due to reflection of light from the surfaces of the signal lines.

In such an embodiment, in a plan view, the edge of the opening OPN may have an embossed or curved shape in which a recess portion and a convex portion are repeatedly arranged, rather than having a straight-line shape. Since the edge of the opening OPN is formed not in a straight line, but in an embossed shape in which the recess portion and the convex portion are repeatedly arranged, the effect of diffraction of light that may occur around the opening OPN may be reduced.

Figure 6:
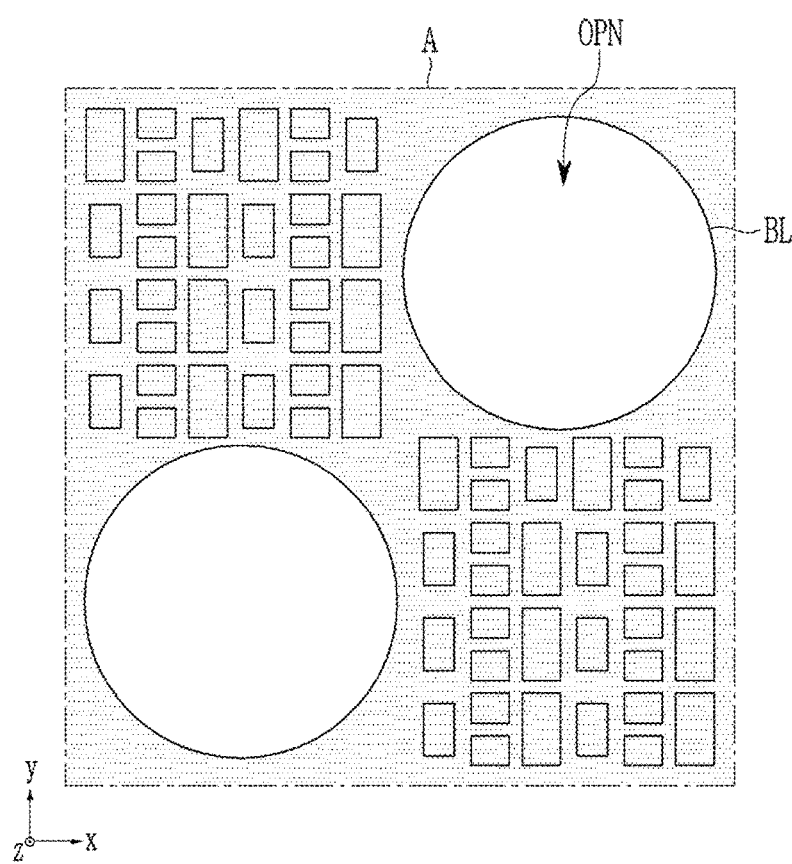
FIG. 6 is a schematic enlarged view of a second pixel area of a display device according to another alternative embodiment.

Next, referring to FIG. 6, a second pixel area PA2 of a display device according to another alternative embodiment will be described. FIG. 6 is a schematic enlarged view of a second pixel area of a display device according to another alternative embodiment.

Referring to FIG. 6, in an embodiment, an opening OPN of a metal blocking layer BL has an approximately circular planar shape. Alternatively, the opening OPN of the metal blocking layer BL may have an approximately elliptical planar shape.

The metal blocking layer BL may include a metal, and may prevent light from outside from being introduced into the second pixel area PA2, and may prevent light passing through a transmission area TA from diffracting around the transmission area TA.

In such an embodiment, where the opening OPN of the metal blocking layer BL has an approximately circular or elliptical planar shape, the effect of diffraction of light that may occur around the opening OPN of the metal blocking layer BL may be reduced.

The metal blocking layer BL is disposed to overlap a wiring area WA where signal lines for transmitting signals to the second pixel area PA2 are positioned, thereby preventing inflow of light to the signal lines disposed to the wiring area WA and light from being viewed from the transmission area TA due to reflection of light from the surfaces of the signal lines.

Figure 7:
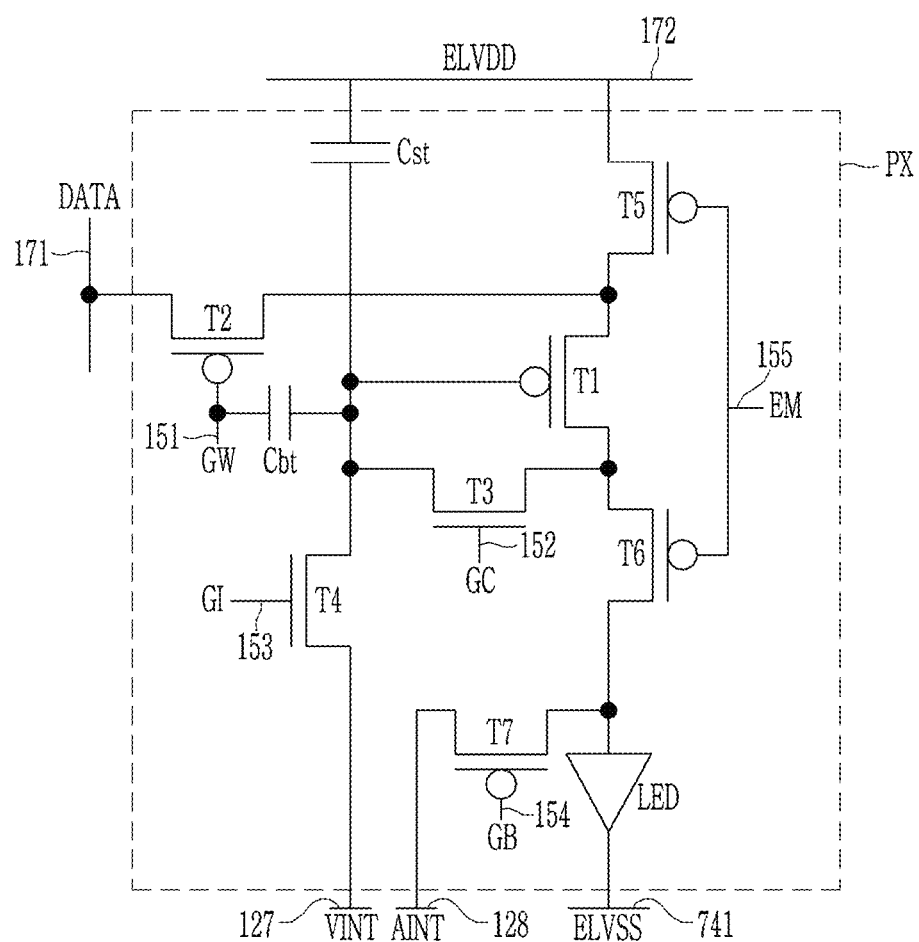
FIG. 7 is a circuit diagram of a pixel of a display device according to an embodiment.

Referring to FIG. 7, a pixel circuit of a pixel of display areas DA1 and DA2 of a display device according to an embodiment will be described. FIG. 7 is a circuit diagram of a pixel of a display device according to an embodiment.

In an embodiment, as shown in FIG. 7, a pixel of a display device includes a plurality of transistors T1, T2, T3, T4, T5, T6, and T7 connected to a plurality of wires 127, 128, 151, 152, 153, 154, 155, 171, 172, and 741, a storage capacitor Cst, a boost capacitor Cbt, and a light emitting diode LED.

A plurality of wires 127, 128, 151, 152, 153, 154, 155, 171, 172, and 741 is connected to one pixel PX. The plurality of wires may include a first initialization voltage line 127, a second initialization voltage line 128, a first scan line 151, a second scan line 152, an initialization control line 153, a bypass control line 154, a light emission control line 155, a data line 171, a driving voltage line 172, and a common voltage line 741.

The first scan line 151 is connected to a gate driver (not shown) and transmits a first scan signal GW to a second transistor T2. The second scan line 152 may be applied with a voltage having a polarity opposite to that of a voltage applied to the first scan line 151 at the same timing as the signal of the first scan line 151. In one embodiment, for example, where a negative voltage is applied to the first scan line 151, a positive voltage may be applied to the second scan line 152. The second scan line 152 transmits a second scan signal GC to a third transistor T3.

The initialization control line 153 transmits an initialization control signal GI to a fourth transistor T4. The bypass control line 154 transmits a bypass signal GB to a seventh transistor T7. The bypass control line 154 may be a first scan line 151 of a previous stage. The light emission control line 155 transmits a light emission control signal EM to a fifth transistor T5 and a sixth transistor T6.

The data line 171 is a wire for transmitting a data voltage DATA generated from a data driver (not shown), and luminance of the light emitting diode LED is changed based on the data voltage DATA applied to the pixel PX.

The driving voltage line 172 applies a driving voltage ELVDD. The first initialization voltage line 127 transmits a first initialization voltage VINT, and a second initialization voltage line 128 transmits a second initialization voltage AINT. The common voltage line 741 applies a common voltage ELVSS to a cathode of the light emitting diode LED. In such an embodiment, the driving voltage line 172, the first and second initialization voltage lines 127, and 128, and the common voltage line 741 may be applied with constant voltages, respectively.

The plurality of transistor may include a driving transistor T1, the second transistor T2, the third transistor T3, the fourth transistor T4, the fifth transistor T5, the sixth transistor T6, and the seventh transistor T7. The plurality of transistors may include an oxide transistor including an oxide semiconductor and a polycrystalline transistor including a polycrystalline semiconductor. In one embodiment, for example, the third transistor T3 and the fourth transistor T4 may be oxide transistors, and the driving transistor T1, the second transistor T2, the fifth transistor T5, the sixth transistor T6, and the seventh transistor T7 may be silicon transistors. However, the embodiment is not limited thereto, and alternatively, the plurality of transistors may all be silicon transistors.

In an embodiment, as described above with reference to FIG. 7, one pixel PX may include seven transistors T1 to T7, one storage capacitor Cst, and one boost capacitor Cbt, but is not limited thereto, and the number of transistors and capacitors, and the connection relationships thereof may be variously modified.

Figure 8:
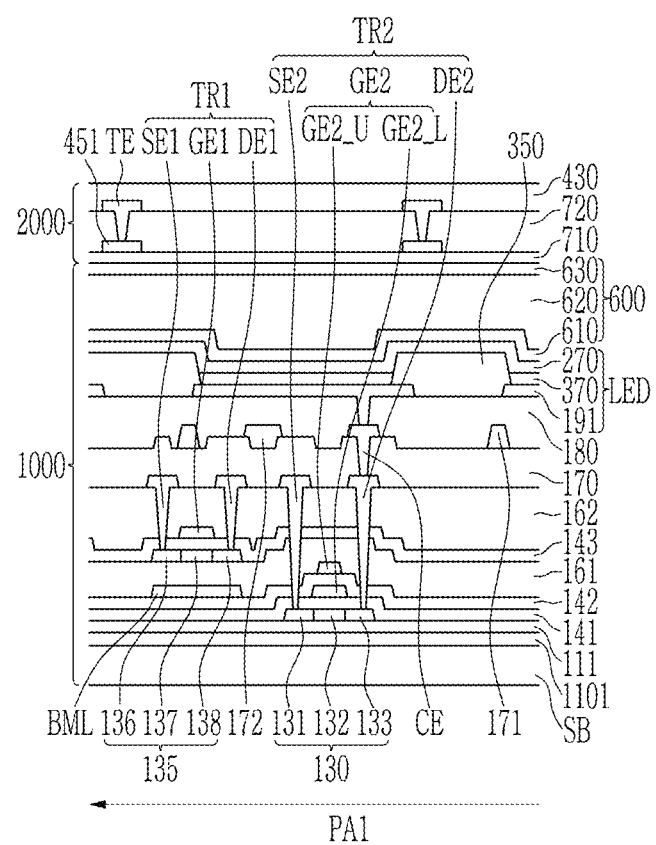
FIG. 8 is a cross-sectional view of a first display area of the display device according to an embodiment.

Next, referring to FIG. 8 and FIG. 9, a first display area and a second display area of the display device according to an embodiment will be described in greater detail. FIG. 8 is a cross-sectional view of a first display area of the display device according to an embodiment, and FIG. 9 is a cross-sectional view of a second display area of the display device according to an embodiment.

Figure 9:
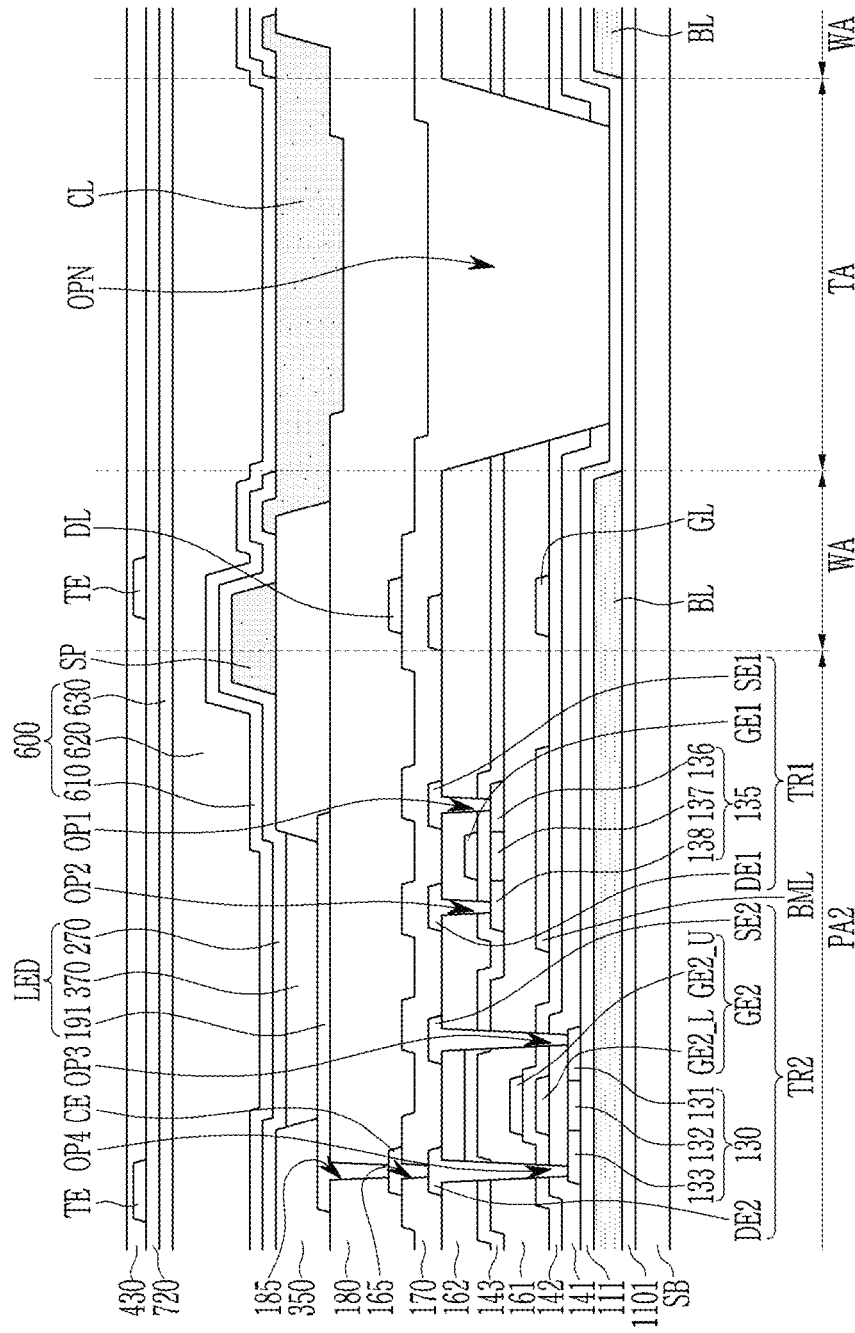
FIG. 9 is a cross-sectional view of a second display area of the display device according to an embodiment.

In FIG. 8 and FIG. 9, for convenience of illustration and description, a first transistor TR1, a second transistor TR2, and a light emitting diode LED connected to the first transistor TR1 and the second transistor TR2 are shown and will be mainly described, but not being limited thereto. In such an embodiment, transistors other than the first transistor TR1 and the second transistor TR2 described above with reference to FIG. 7 may be included.

First, referring to FIG. 8, in an embodiment, a first pixel area PA1 of a first display area DA1 of the display device includes a display portion 1000 and a touch portion 2000.

In an embodiment, a first pixel area PA1 of a first display area DA1 of the display device may include a substrate SB including an insulating material such as a polymer such as polyimide or polyamide, or glass, and may be optically transparent.

The substrate SB may include a first transparent layer (not shown) and a second transparent layer (not shown) that overlap each other, and a first barrier layer (not shown) that is disposed between the first transparent layer and the second transparent layer.

The first transparent layer and the second transparent layer may include a polymer such as polyimide, polyamide, and the like. The first and second transparent layers may include at least one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The first barrier layer may prevent permeation of moisture and the like, and for example, may include an inorganic insulating material such as a silicon oxide (SiOx), a silicon nitride (SiNx), and a silicon oxynitride (SiOxNy). The first barrier layer may include amorphous silicon (Si).

In such an embodiment, a second barrier layer 1101 may be disposed on the substrate SB.

The second barrier layer 1101 serves to flatten the surface while preventing the penetration of undesired components such as an impurity or moisture. The second barrier layer 1101 may include at least one selected from a silicon oxide, a silicon nitride, a silicon oxynitride, and amorphous silicon. In such an embodiment, a buffer layer 111 is disposed on the second barrier layer 1101.

The buffer layer 111 is disposed between the substrate SB and a semiconductor layer 130 to block impurities from the substrate SB during the crystallization process to form a polysilicon, thereby improving the characteristics of the polysilicon.

The buffer layer 111 may include an inorganic insulating material such as a silicon oxide (SiOx), a silicon nitride (SiNx), and a silicon oxynitride (SiOxNy). The buffer layer 111 may include amorphous silicon (Si).

In such an embodiment, the semiconductor (hereinafter, a second semiconductor) 130 may be disposed on the buffer layer 111. The second semiconductor 130 may include a polysilicon material. In such an embodiment, the second semiconductor 130 may include or be formed of a polycrystalline semiconductor. The second semiconductor 130 may include a source region 131, a channel region 132, and a drain region 133.

The source region 131 of the second semiconductor 130 may be connected with a second source electrode SE2 through a contact hole OP3 defined through layers thereabove 141, 142, 161, 143 and 162, and the drain region 133 of the second semiconductor 130 may be connected with a second drain electrode DE2 through a contact hole OP4 defined through layers thereabove 141, 142, 161, 143 and 162.

In such an embodiment, a first gate insulating layer 141 may be disposed on the second semiconductor 130. The first gate insulating layer 141 may have a single layer or multilayer structure including at least one selected from a silicon nitride, a silicon oxide, a silicon oxynitride, and the like.

In such an embodiment, a second gate lower electrode GE2_L may be disposed on the first gate insulating layer 141. The second gate lower electrode GE2_L may include molybdenum (Mo), aluminum (Al), copper (Cu), and/or titanium (Ti), and may have a single layer or multi-layer structure including at least one selected from the above-listed materials.

In such an embodiment, a second gate insulating layer 142 may be disposed on the second gate lower electrode GE2_L. The second gate insulating layer 142 may include at least one selected from a silicon nitride, a silicon oxide, a silicon oxynitride, and the like. The second gate insulating layer 142 may have a single layer or multi-layer structure including at least one selected form a silicon nitride, a silicon oxide, a silicon oxynitride, and the like.

In such an embodiment, a second gate upper electrode GE2_U may be disposed on the second gate insulating layer 142. The second gate lower electrode GE2_L and the second gate upper electrode GE2_U may overlap each other, with the second gate insulating layer 142 disposed therebetween. The second gate upper electrode GE2_U and the second gate lower electrode GE2_L form or collective define a second gate electrode GE2. The second gate electrode GE2 may overlap the channel region 132 of the second semiconductor 130 in a thickness direction of the substrate SB.

The second gate upper electrode GE2_U and a gate line GL may include at least one selected from molybdenum (Mo), aluminum (Al), copper (Cu), silver (Ag), chromium (Cr), tantalum (Ta), titanium (Ti), and the like, and may have a single layer or multi-layer structure including at least one selected from the above-listed materials.

A metal layer BML, which is disposed in a same layer as the second gate upper electrode GE2_U and gate line GL, may be disposed on the second gate insulating layer 142, and the metal layer BML may overlap the first transistor TR1, which will be described later, in the thickness direction of the substrate SB. The metal layer BML is connected with a driving voltage line, or a gate electrode or a source electrode of the first transistor TR1, and thus may serve as a lower gate electrode.

The second semiconductor 130, the second gate electrode GE2, the second source electrode SE2, and the second drain electrode DE2 form or collectively defined a second transistor TR2. The second transistor TR2 may be a driving transistor connected with the light emitting diode LED, and may be formed as a transistor including a polycrystalline semiconductor.

In such an embodiment, a first interlayer insulating layer 161 may be disposed on the second gate electrode GE2. The first interlayer insulating layer 161 may include at least one selected from a silicon nitride, a silicon oxide, a silicon oxynitride, and the like. The first interlayer insulating layer 161 may have a multilayer structure in which a layer including silicon nitride and a layer including silicon oxide are stacked one on another. In such an embodiment, the layer including a silicon nitride in the first interlayer insulating layer 161 may be disposed closer to the substrate SB than the layer including a silicon oxide.

In such an embodiment, a first semiconductor 135 may be disposed on the first interlayer insulating layer 161. The first semiconductor 135 may overlap the metal layer BML in the thickness direction of the substrate SB.

The first semiconductor 135 may include an oxide semiconductor. The oxide semiconductor may include at least one selected from indium oxide ($In_2O_3$), tin oxide (SnO), zinc oxide (ZnO), hafnium oxide ($HfO_2$), and aluminum oxide ($Al_2O_3$). In one embodiment, for example, the first semiconductor 135 may include indium-gallium-zinc oxide (IGZO).

The first semiconductor 135 may include a channel region 137, and a source region 136 and a drain region 138 disposed at opposite sides of the channel region 137. The source region 136 of the first semiconductor 135 may be connected with the first source electrode SE1 through a contact hole OP1 defined through layers thereabove 143 and 162, and the drain region 138 of the first semiconductor 135 may be connected with the first drain electrode DE1 SE1 through a contact hole OP2 defined through layers thereabove 143 and 162.

In such an embodiment, a third gate insulating layer 143 may be disposed on the first semiconductor 135. The third gate insulating layer 143 may include at least one selected from a silicon nitride, a silicon oxide, a silicon oxynitride, and the like.

In an embodiment, as shown in FIGS. 8 and 9, the third gate insulating layer 143 may be disposed on an entire surface of the first semiconductor 135 and the first interlayer insulating layer 161. Thus, the third gate insulating layer 143 covers the top and side surfaces of the source region 136, the channel region 137, and the drain region 138 of the first semiconductor 135.

If the third gate insulating layer 143 does not cover the top surfaces of the source region 136 and the drain region 138, some material of the first semiconductor 135 may move to the side of the third gate insulating layer 143. In an embodiment, since the third gate insulating layer 143 is disposed on the entire surface of the first semiconductor 135 and the first interlayer insulating layer 161, a short circuit between the first semiconductor 135 and the first gate electrode GE1 due to diffusion of metal particles may be effectively prevented.

However, embodiments are not limited thereto, and alternatively, the third gate insulating layer 143 may not be disposed on the entire surface of the first semiconductor 135 and the first interlayer insulating layer 161. In one embodiment, for example, the third gate insulating layer 143 may be disposed only between the first gate electrode GE1 and the first semiconductor 135. In such an embodiment, the third gate insulating layer 143 may overlap the channel region 137 of the first semiconductor 135 in the thickness direction of the substrate SB, and may not overlap the source region 136 and the drain region 138 of the first semiconductor 135 in the thickness direction of the substrate SB. Accordingly, a channel length of the semiconductor may be reduced during a process for implementing high resolution.

The first gate electrode GE1 may be disposed on the third gate insulating layer 143.

The first gate electrode GE1 may overlap the channel region 137 of the first semiconductor 135 in the thickness direction of the substrate SB. The first gate electrode GE1 may include at least one selected from molybdenum (Mo), aluminum (Al), copper (Cu), and titanium (Ti), and may have a single layer or multi-layer structure including at least one selected from the above-listed materials. In one embodiment, for example, the first gate electrode GE1 may include a lower layer including titanium and an upper layer containing molybdenum, and the lower layer including titanium prevents the diffusion of fluorine (F), which is an etching gas, during dry etching of the upper layer.

The first semiconductor 135, the first gate electrode GE1, the first source electrode SE1, and the first drain electrode DE1 form or collectively define the first transistor TR1. The first transistor TR1 may be a switching transistor for switching of the second transistor TR2, and may be provided as a transistor including an oxide semiconductor.

A second interlayer insulating layer 162 may be disposed on the first gate electrode GE1. The second interlayer insulating layer 162 may include at least one selected from a silicon nitride, a silicon oxide, a silicon oxynitride, and the like.

The second interlayer insulating layer 162 may have a multilayer structure in which layers including a silicon oxynitride and a silicon oxide are stacked one on another.

The first source electrode SE1, the first drain electrode DE1, the second source electrode SE2, and the second drain electrode DE2 may be disposed on the second interlayer insulating layer 162. The first source electrode SE1, the first drain electrode DE1, the second source electrode SE2, and the second drain electrode DE2 may include at least one selected from aluminum (Al), molybdenum (Mo), titanium (Ti), tungsten (W), and copper (Cu), and may have single layer or multi-layer structures including at least one selected from the above-listed materials. In one embodiment, for example, the first source electrode SE1, the first drain electrode DE1, the second source electrode SE2, and the second drain electrode DE2 may have triple-layer structures including a lower layer including refractory metals such as titanium, molybdenum, chromium, and tantalum, or an alloy thereof, an interlayer including an aluminum-based metal, a silver-based metal, and a copper-based metal with low resistivity, and an upper layer including refractory metals such as titanium, molybdenum, chromium, and tantalum.

The first source electrode SE1 may be connected with the source region 136 of the first semiconductor 135 through the contact hole OP1, and the first drain electrode DE1 may be connected with the drain region 138 of the first semiconductor 135 through the contact hole OP2.

The second source electrode SE2 may be connected with the source region 131 of the second semiconductor 130 through the contact hole OP3, and the second drain electrode DE2 may be connected with the drain region 133 of the second semiconductor 130 through the contact hole OP4.

A first insulation layer 170 may be disposed on the first source electrode SE1, the first drain electrode DE1, the second source electrode SE2, and the second drain electrode DE2. The first insulation layer 170 may be an organic layer or an inorganic layer. In one embodiment, for example, the first insulation layer 170 may include an organic insulating material such as a general-purpose polymer such as poly(methyl methacrylate) ("PMMA") or polystyrene ("PS"), a polymer derivative having a phenolic group, an acryl-based polymer, an imide-based polymer, polyimide, an acryl-based polymer, and a siloxane-based polymer.

A connection electrode CE, a data line 171, and a driving voltage line 172 may be disposed on the first insulation layer 170. The connection electrode CE and the data line 171 may include at least one selected from aluminum (Al), silver (Ag), magnesium (Mg), gold (Au), nickel (Ni), chromium (Cr), calcium (Ca), molybdenum (Mo), titanium (Ti), tungsten (W), and copper (Cu), and may have single-layer or multi-layer structure.

The connection electrode CE is connected with the second drain electrode DE2 through a contact hole 165 defined through first insulation layer 170.

A second insulation layer 180 may be disposed on the first insulation layer 170, the connection electrode CE, and the data line 171. The second insulation layer 180 may serve to flatten and remove steps in order to increase the luminous efficiency of the emission layer to be formed thereon. The second insulation layer 180 may include an organic insulating material such as a general-purpose polymer such as PMMA or PS, a polymer derivative having a phenolic group, an acryl-based polymer, an imide-based polymer, polyimide, an acryl-based polymer, and a siloxane-based polymer.

A pixel electrode 191 may be disposed on the second insulation layer 180. The pixel electrode 191 may contact the second drain electrode DE2 through a contact hole 185 of the second insulation layer 180.

The pixel electrode 191 may be provided individually for each pixel PX. The pixel electrode 191 may include a metal such as silver (Ag), lithium (Li), calcium (Ca), aluminum (Al), magnesium (Mg), gold (Au), and the like, and may include a transparent conductive oxide ("TCO") such as ITO, IZO, and the like. The pixel electrode 191 may have a single layer or multi-layer structure including a metal material or a transparent conductive oxide. In one embodiment, for example, the pixel electrode 191 may have a triple layer structure of ITO/silver (Ag)/ITO.

A pixel defining layer 350 may be disposed on the pixel electrode 191. The pixel defining layer 350 may include an organic insulating material such as a general-purpose polymer such as PMMA or PS, a polymer derivative having a phenolic group, an acryl-based polymer, an imide-based polymer, polyimide, an acryl-based polymer, and a siloxane-based polymer. The pixel defining layer 350 may include a black dye and not transmit light.

A pixel opening may be defined or formed in the pixel defining layer 350, and the pixel opening of the pixel defining layer 350 may overlap the pixel electrode 191. An emission layer 370 may be disposed in the pixel opening of the pixel defining layer 350.

The emission layer 370 may include a material layer that emits light of one of basic colors (or primary colors) such as red, green, and blue. The emission layer 370 may have a structure in which a plurality of material layers for emitting light of different colors are stacked one on another.

In one embodiment, for example, the emission layer 370 may be an organic emission layer, and the organic emission layer may be multi-layers including one or more of an emission layer, a hole-injection layer ("HTL"), a hole-transporting layer ("HTL"), an electron-transporting layer ("ETL"), and an electron-injection layer ("EIL"). In an embodiment, where the organic emission layer includes all of the layers listed above, the hole-injection layer HIL is positioned on the anode pixel electrode 191, the hole transport layer ("HTL"), the emission layer, the electron-transporting layer ("ETL"), the electron-injecting layer ("EIL") may be stacked sequentially thereabove.

A common electrode 270 may be disposed on the emission layer 370 and the pixel defining layer 350. The common electrode 270 may be disposed in common with all pixel PXs, and the common voltage ELVSS may be applied through a common voltage transmission portion 27 of a non-display area NA. The common electrode 270 may include a reflective metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), and the like, or a TCO such as ITO, IZO, and the like.

The pixel electrode 191, the emission layer 370, and the common electrode 270 may form or collectively define the light emitting diode LED. In an embodiment, the pixel electrode 191 may be an anode, which is a hole-injecting electrode, and the common electrode 270 may be a cathode, which is an electron-injecting electrode. However, the embodiment is not limited thereto, and alternatively, the pixel electrode 191 may be a cathode and the common electrode 270 may be an anode depending on a driving method of the display device.

Holes and electrons from the pixel electrode 191 and the common electrode 270 are injected into the emission layer 370, and light emitting occurs when the exciton of which the injected hole and electron are combined falls from an exited state to a ground state.

In an embodiment, the first transistor TR1, which is a switching transistor of the display device, may include an oxide semiconductor, and the second transistor TR2, which is a driving transistor, may include a polycrystalline semiconductor. For high-speed driving, motion of a motion picture may be expressed more naturally by increasing the existing frequency of about 60 hertz (Hz) to about 120 Hz, but power consumption may be increased. To compensate for the increased power consumption, the frequency when driving a still image may be lowered. In one embodiment, for example, when driving a still image, it can be driven at about 1 Hz. When the frequency is lowered as described above, a leakage current may occur. In an embodiment of the display device, the leakage current may be minimized by using the first transistor TR1, which is a switching transistor, including an oxide semiconductor. In such an embodiment, since the second transistor TR2, which is a driving transistor, includes a polycrystalline semiconductor, it may have high electron mobility. In such an embodiment, the switching transistor and the driving transistor include different semiconductor materials from each other, and thus more stable driving and high reliability may be provided.

An encapsulation layer 600 is disposed on the common electrode 270. The encapsulation layer 600 may cover not only the upper surface of the display portion 1000 but also the side surface of the display portion 1000 to seal the display portion 1000.

The encapsulation layer 600 may include a plurality of layers, and may be a composite layer including both an inorganic layer and an organic layer. In one embodiment, for example, the encapsulation layer 600 may be defined by a triple layer in which a first encapsulation inorganic layer 610, an encapsulation organic layer 620, and a second encapsulation inorganic layer 630 are sequentially disposed one on another.

The touch portion 2000 is disposed on the encapsulation layer 600.

The touch portion 2000 will now be briefly described. A third insulation layer 710 is disposed on the encapsulation layer 600. The third insulation layer 710 may include or be formed of an inorganic or organic layer such as a metal oxide, a metal oxynitride, a silicon oxide, a silicon nitride, and a silicon oxynitride. The third insulation layer 710 covers the encapsulation layer 600 to protect the encapsulation layer 600 and prevent moisture penetration. In addition, the third insulation layer 710 may serve to reduce parasitic capacitance between the common electrode 270 and the touch electrode.

A first touch cell connection portion 451 is disposed on the third insulation layer 710, and a fourth insulation layer 720 is disposed on the first touch cell connection portion 452. The fourth insulation layer 720 may include or be formed of an inorganic or organic layer such as a metal oxide, a metal oxynitride, a silicon oxide, a silicon nitride, and a silicon oxynitride.

A first touch cell TE is disposed on the fourth insulation layer 720. In an embodiment, although it is not illustrated, a second touch cell and a second touch cell connection portion may be also disposed on the fourth insulation layer 720. In such an embodiment, one of the first touch cell TE and the second touch cell may be a detection input electrode, and the other of the first touch cell TE and the second touch cell may be a detection output electrode. The first touch cell TE and the second touch cell may be electrically separated from each other, and may be disposed not to overlap each other and to be disposed in a mesh form. The first touch cells TE may be connected with each other by a first touch cell connection portion 451, and the second touch cells may be connected with each other by the second touch cell connection portion.

A touch cell protective layer 430 may be disposed on the first touch cell TE and the second touch cell (not shown). The touch cell protective layer 430 may protect the first touch cell TE and the second touch cell (not shown) by covering the first touch cell TE and the second touch cell (not shown) so that they are not exposed outside. The touch cell protective layer 430 may include an inorganic material such as a silicon nitride (SiNx) or a silicon oxide (SiO$_2$), a polyacrylate resin, a polyimide resin, or an acryl-based organic material.

Next, referring to FIG. 9, a second display area DA2 of a display device according to an embodiment includes a second pixel area PA2 where an image is displayed, a transmission area TA, and a wiring area WA disposed at the periphery of the second pixel area PA2.

An interlayer structure of the second pixel area PA2 that displays an image is similar to the interlayer structure of the first pixel area PA1 of the display device described with reference to FIG. 8. Any repetitive detailed description of the same constituent elements will hereinafter be omitted.

In an embodiment, as shown in FIG. 9, a metal blocking layer BL is disposed on a second barrier layer 1101. The metal blocking layer BL may prevent visual recognition due to inflow of light from a lower portion of a substrate 110. In such an embodiment, the metal blocking layer BL is disposed between the second pixel area PA2 and the wiring area WA, excluding the transmission area TA, and prevents light leakage at the periphery of the transmission area TA such that performance degradation due to undesired light from electronic devices located under the transmission area TA may be prevented.

The metal blocking layer BL may include an organic material including a black color, a metal oxide, or a metal.

A buffer layer 111 may be disposed on the second barrier layer 1101 and the metal blocking layer BL.

Configurations from the buffer layer 111 to a touch cell protective layer 430 are the same as the configurations from those described above with reference to FIG. 8.

As a portion including an opening OPN where the metal blocking layer BL disposed in the second pixel area PA2 is removed, the transmission area TA may be defined by edge portions of the metal blocking layer BL.

The metal blocking layer BL disposed in the second pixel area PA2 is also disposed in the wiring area WA. A gate line GL and a data line DL may be disposed in the wiring area WA.

The metal blocking layer BL blocks light incident under the substrate SB, that is, from the back side of the substrate SB, and thus light from an electronic device e.g., an optical device, disposed on the back of the substrate SB of the transmission area TA may be effectively transmitted through the display device, thereby increasing an optical characteristic of the optical device.

A spacer SP may be disposed on a part of a pixel defining layer 350 that is disposed in the second pixel area PA2. The spacer SP may be disposed between the second pixel area PA2 and the transmission area TA on a plane.

The spacer SP may include an organic material.

The spacer SP supports a mask used in a manufacturing process, thereby preventing defects from occurring in the emission layer 370 due to sagging of the mask.

A plurality of insulation layers 141, 142, 143, 161, and 162 disposed in the second pixel area PA2 may be removed in the transmission area TA, but the plurality of insulation layers 141, 142, 143, 161, and 162 may be partially disposed at the side surface of the metal blocking layer BL.

Since the side surface of the metal blocking layer BL is provided by being covered by parts of the plurality of insulation layers 141, 142, 143, 161, and 162, the metal blocking layer BL may be effectively prevented from corroding during the manufacturing process.

The first insulation layer 170 and the second insulation layer 180 also remain in the transmission area TA, thus may help to flatten the layers disposed below the encapsulation layer 600.

A planarization layer CL may be disposed on the second insulation layer 180 that is disposed in the transmission area TA. A surface level of the planarization layer CL disposed in the transmission area TA may be approximately the same as a surface level of the pixel defining layer 350. Herein, a surface level may means a height of an upper surface with respect to a reference surface, e.g., an upper surface of substrate SB. The planarization layer CL may contact the side of the pixel defining layer 350, and may contact at least a portion of the upper surface of the pixel defining layer 350. A difference in surface level of the planarization layer CL disposed in the transmission area TA may be about 0.5 micrometer (µm) or less.

The planarization layer CL may be formed together with the spacer SP using a same layer. The planarization layer CL may include a same material as the spacer SP. The planarization layer CL may include an organic material.

Light may be transmitted to or from an optical device (not shown) that is disposed on the back surface of the substrate SB through the transmission area TA. The optical device may be a sensor, a camera, a flash, or the like.

In such an embodiment, the insulation layers 170 and 180 disposed in the transmission area TA may not have flat surfaces due to steps between the insulation layers 141, 142, 143, 161, and 162 disposed at the periphery of the edge of the metal blocking layer BL and areas where the insulation layers 141, 142, 143, 161, and 162 are disposed, and the not-flat surfaces of the insulation layers 170 and 180 function as a lens such that a path of light generated from the optical device may be changed, thereby deteriorating the optical characteristics of the optical device.

In an embodiment of the invention, as described above, the planarization layer CL may be disposed on the second insulation layer 180 that is disposed in the transmission area TA of the display device, and a surface level of the planarization layer CL disposed in the transmission area TA may be substantially the same as a surface level of the pixel defining layer 350, while having a flat surface.

Thus, in such an embodiment of the display device, when light passes through the transmission area TA from the optical device, the path of light may be effectively prevented from being changed due to the difference in the height of the surface of the insulation layers disposed in the transmission area TA, and the optical characteristic deterioration of the optical device may be effectively prevented.

In an embodiment, the encapsulation layer 600 is disposed in the entire area including the light emitting diode LEDs of the pixel areas PA1 and PA2, the pixel defining layer 350, and the transmission area TA to cover the entire surface of the substrate SB.

In a case where the height difference between the layers disposed under the encapsulation layer 600 is large, a step may be formed in the encapsulation layer 600 as well, whereby sealing may be difficult by the encapsulation layer 600. In an embodiment, as described above, the planarization layer CL may be disposed on the second insulation layer 180 disposed in the transmission area TA of the display device, and the first insulation layer 170, the second insulation layer 180, and the planarization layer CL reduce a step of the insulation layer, which may be formed below the encapsulation layer 600 disposed in the transmission area TA, thereby preventing a step of the encapsulation layer 600 from being formed and increasing sealing efficiency of the encapsulation layer 600.

In such an embodiment, as described above, the planarization layer CL may be formed together with the spacer SP using a same layer, thereby flattening the surface of the insulation layer of the transmission area TA without adding a manufacturing process or increasing manufacturing cost.

Figure 10:
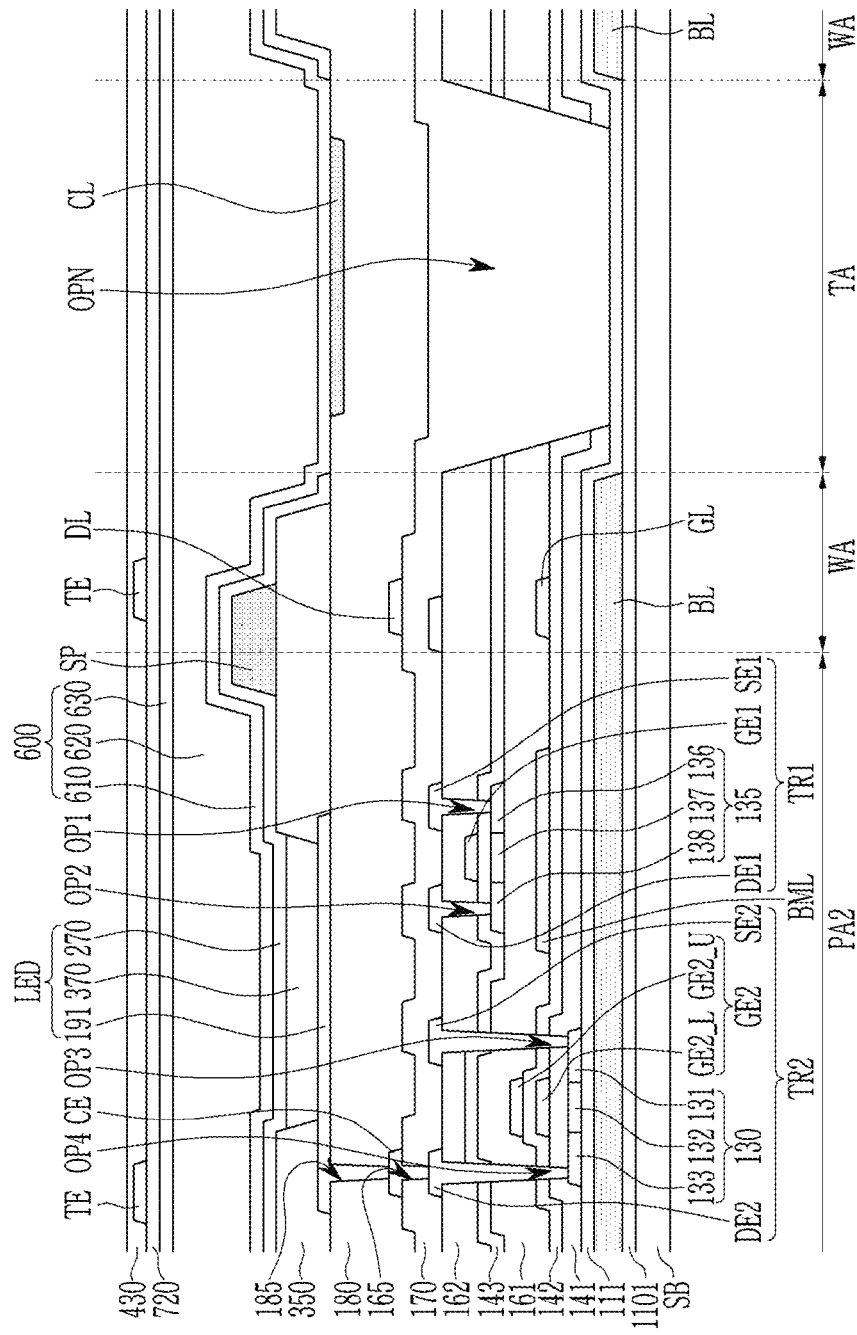
FIG. 10 is a cross-sectional view of a second display area of a display device according to an alternative embodiment.

Next, referring to FIG. 10, a second display area of a display device according to an alternative embodiment will be described. FIG. 10 is a cross-sectional view of a second display area of a display device according to an alternative embodiment. The second display area of the display device shown in FIG. 10 is similar to the second display area of the display device described above with reference to FIG. 8 and FIG. 9. Any repetitive detailed description of the same constituent element will hereinafter be omitted.

Referring to FIG. 10, in an embodiment of the second display area of the display device, a planarization layer CL disposed in a transmission layer TA is disposed to fill a step portion of insulation layers 170 and 180 disposed in the transmission area TA. Thus, the planarization layer CL may not contact the side of the pixel defining layer 350.

In such an embodiment, a surface level of the planarization layer CL may be almost the same as a surface level of the second insulation layer 180, and the planarization layer CL compensates for a step due to insulation layers 141, 142, 143, 161, and 162 removed from the transmission area TA, thereby flattening the surface of the transmission area TA disposed below an encapsulation layer 600.

In such an embodiment, as described above, the planarization layer CL may be disposed on the second insulation layer 180 disposed in the transmission area TA of the display device, and the planarization layer CL compensates for the step due to the insulation layers 141, 142, 143, 161, and 162 removed from the transmission area TA such that the surface of the transmission area TA disposed below an encapsulation layer 600 may be flattened. A difference of a surface level of the planarization layer CL disposed in the transmission area TA may be about 0.5 µm or less.

Thus, in an embodiment of the display device according to the invention, when light passes through the transmission area TA from the optical device disposed therebelow, the path of light may be prevented from being changed due to the difference in the height of the surface of the insulation layers disposed in the transmission area TA, and the optical characteristic deterioration of the optical device may be prevented. In such an embodiment, the planarization layer CL reduces the step that may occur under the encapsulation layer 600 disposed in the transmission area TA, thereby preventing the occurrence of the step in the encapsulation layer 600, and increasing the sealing effect of the encapsulation layer 600. In such an embodiment, as described above, the planarization layer CL may be formed together with a spacer SP using a same layer, thereby flattening the surface of the insulation layer of the transmission area TA without adding a manufacturing process or increasing manufacturing cost.

Other features of the display device shown in FIG. 10p substantially the same as those of the embodiments of the display device described above.

Next, a method for manufacturing a display device according to an embodiment will be described with reference to FIG. 11A to FIG. 11D. FIG. 11A to FIG. 11D are cross-sectional views of a manufacturing process of a display device according to an embodiment.

Figure 11A:
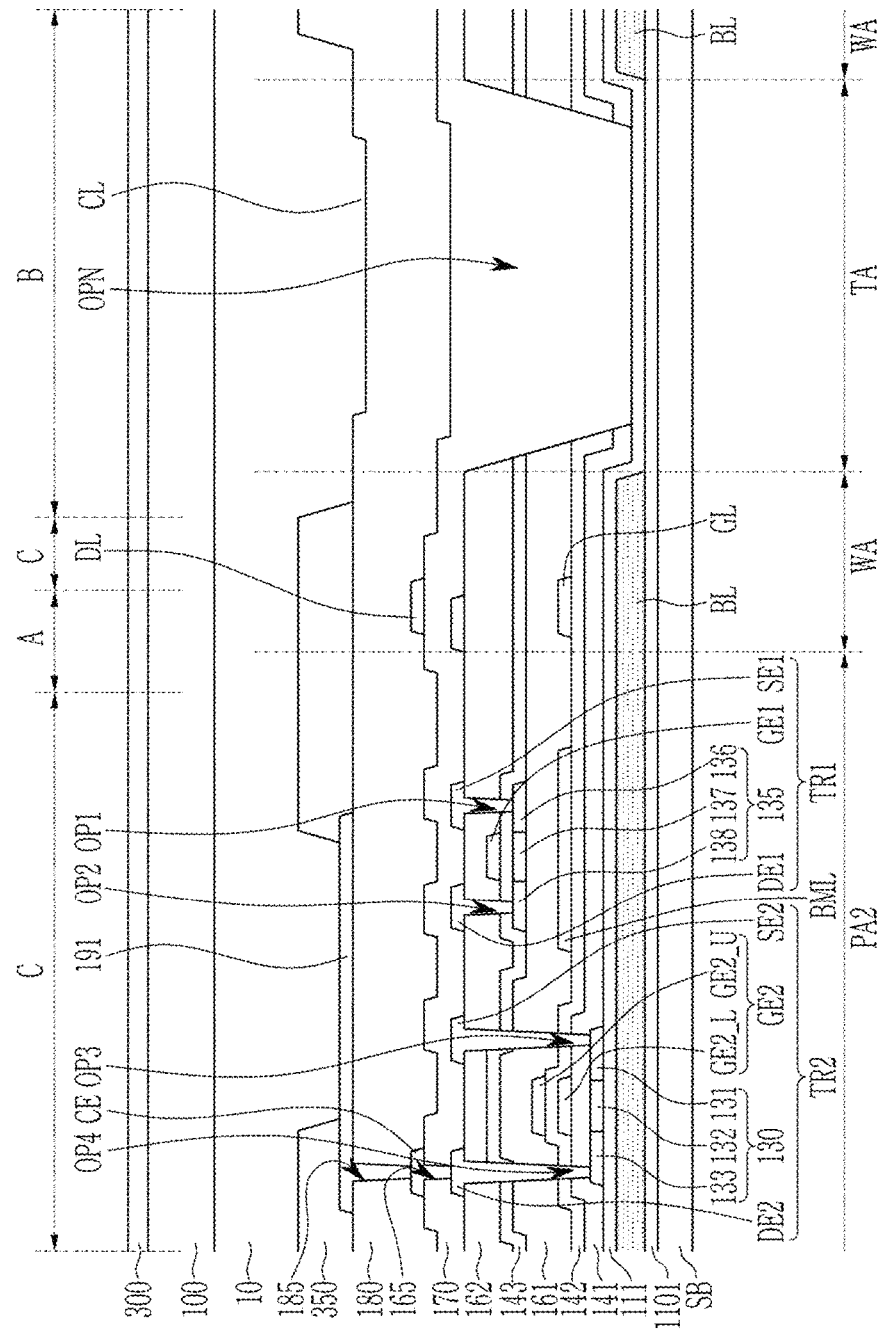
FIG. 11A to FIG. 11D are cross-sectional views of a manufacturing process of a display device according to an embodiment.
Figure 11B:
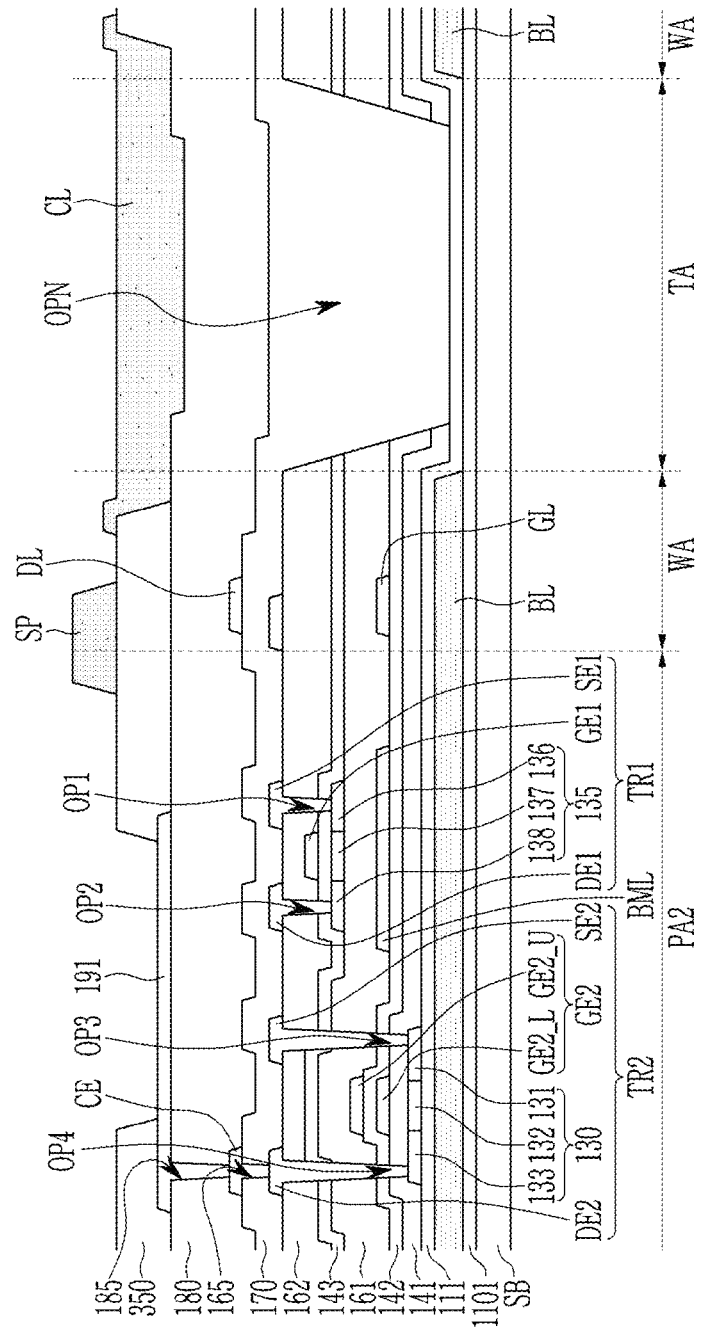

In an embodiment of a method for manufacturing a display device, as shown in FIG. 11A, an insulation layer 10 and a photosensitive film 100 are stacked on a substrate SB that is formed to a pixel defining layer 350, the photosensitive film 100 is exposed and developed by using an exposure mask 300 having a first region A, a second region B, and a third region C, each having different light transmittances from each other, such that photosensitive film patterns having different thicknesses one portion from another are formed, and then a first insulation layer 10 is primarily etched by using photosensitive film patterns with different thicknesses and the insulation layer 10 is secondarily etched with a photosensitive film pattern with reduced heights. Thus, as shown in FIG. 11B, a spacer SP and the planarization layer CL formed or defined by portions of the insulation layer 10 are formed together.

In such an embodiment, the first region A of the exposure mask 300 may be disposed to overlap an area where the spacer SP is to be formed, the second region B of the exposure mask 300 may be disposed to overlap an area where the planarization layer CL is to be formed, and the third region C of the exposure mask 300 may be disposed to overlap remaining regions where the spacer SP and the planarization layer CL are not formed. In one embodiment, for example, the first region A, the second region B, and the third region C may sequentially be a light-transmitting region, a semi-transmissive region, and a light-shielding region, or may be a light-shielding region, a semi-transmissive region, and a light-transmitting region. In one alternative embodiment, for example, the first region A, the second region B, and the third region C may sequentially be a semi-transmissive region, a light-transmitting region, and a light-shielding region, or may be a semi-transmissive region, a light-shielding region, and a light-transmitting region.

In an alternative embodiment, the exposure mask 300 uses a conventional exposure mask having only a light-transmitting area and a light-blocking area, and a photosensitive layer capable of reflow is formed and then reflowed so that the photosensitive layer flows down to an area where the photoresist layer does not remain, thereby forming a thin portion. In such embodiments, by forming the spacer SP and the planarization layer CL through an exposure and etching process using one exposure mask, an increase in the manufacturing process due to the addition of a photo process may be effectively prevented.

Figure 11C:
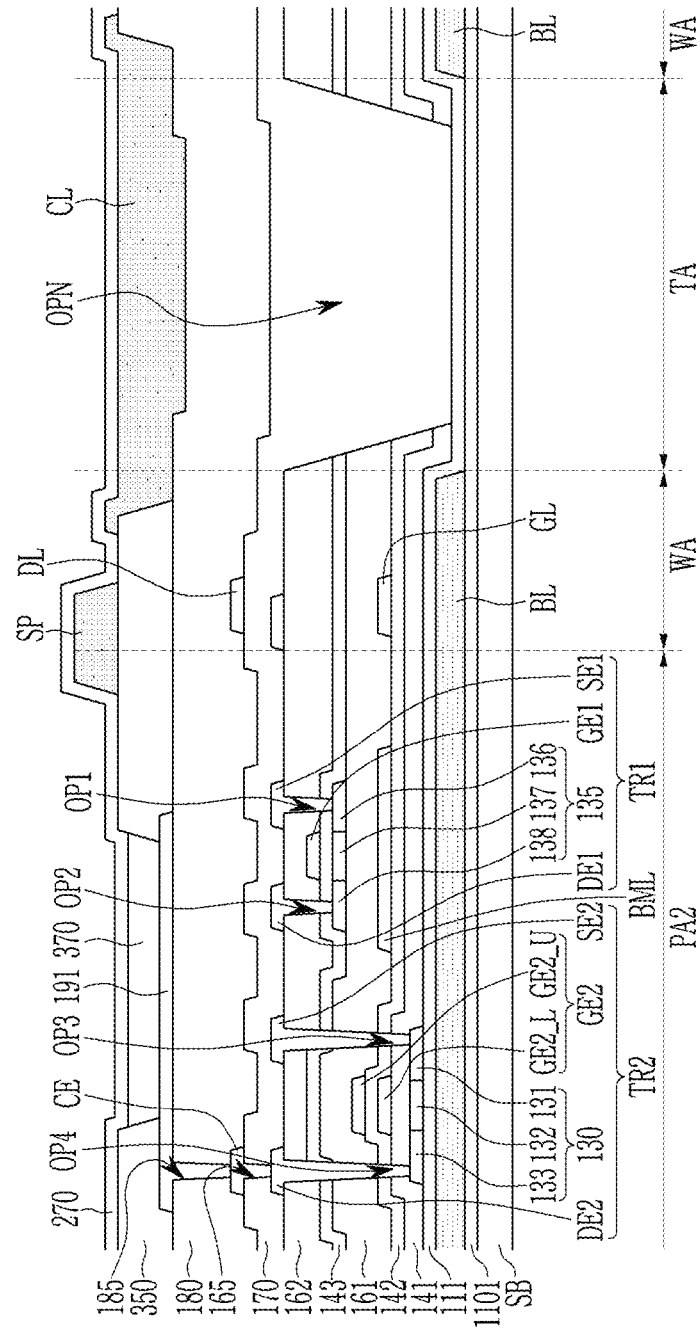
Figure 11D:
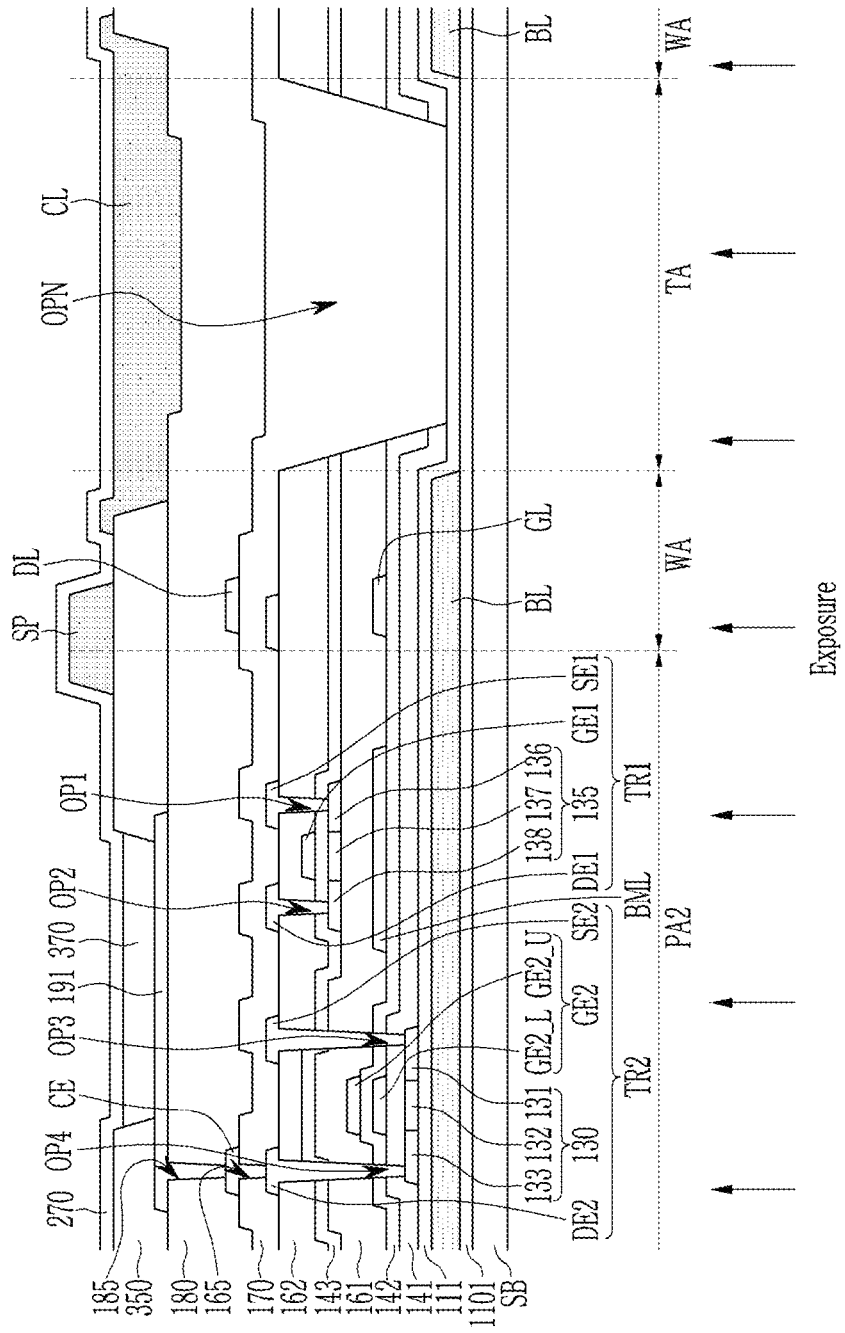

In an embodiment, as shown in FIG. 11C, an emission layer 370 is provided or formed in a pixel opening 365 of the pixel defining layer 350, a common electrode 270 is provided or formed on the entire substrate SB, and then, as shown in FIG. 11D, rear side exposure is carried out through the rear side of the substrate SB using a metal block layer BL as a mask to remove an exposed portion in the common electrode 270, thereby removing the common electrode 270 from the transmission area TA.

Figure 12:
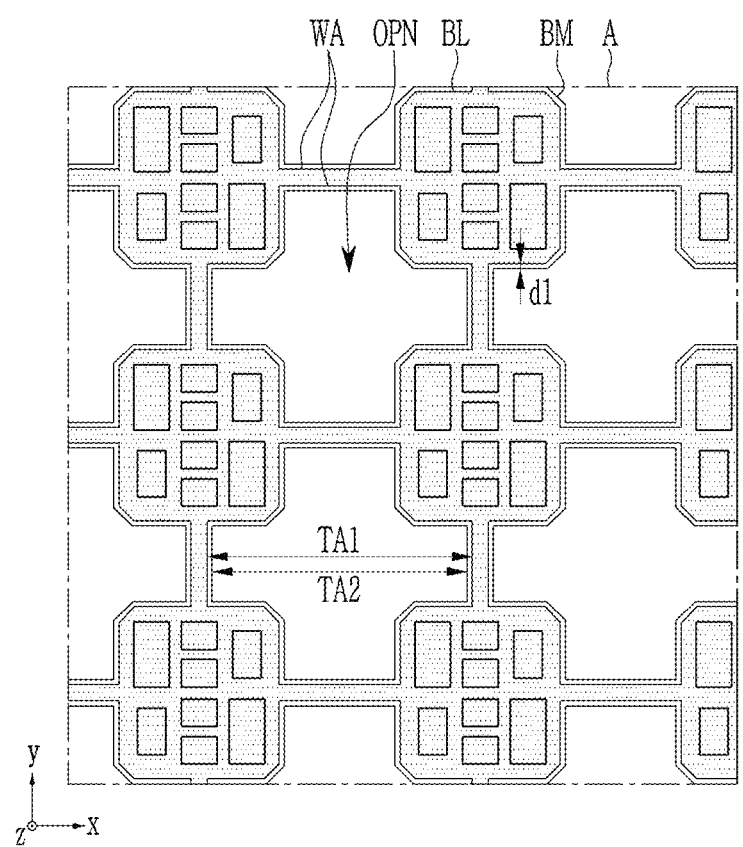
FIG. 12 is a schematic enlarged view of a second pixel area of a display device according to an alternative embodiment.

Next, referring to FIG. 12, a display device according to an alternative embodiment will be described. FIG. 12 is a schematic enlarged view of a second pixel area of a display device according to an alternative embodiment, which is an enlarged view of the area A in FIG. 3.

An embodiment of the second pixel area of the display device shown in FIG. 12 is similar to the embodiments of the second pixel area of the display device described above with reference to FIG. 5 except that the second pixel area PA2 of the display device further includes a light blocking layer BM.

In such an embodiment, a metal blocking layer BL and a light blocking layer BM are disposed in the second pixel area PA2, and openings OPN are defined through the metal blocking layer BL and the light blocking layer BM in a transmission area TA. The metal blocking layer BL and the light blocking layer BM may also be disposed in a wiring area WA. The metal blocking layer BL and the light blocking layer BM are also disposed in the wiring area WA, which is disposed to surround the periphery of the transmission area TA, and prevent the light passing through the transmission area TA from diffracting around the transmission area TA, thereby preventing deterioration of the optical device 40. On the plane, an edge of the light blocking layer BM is protruded by a first interval d1 from an edge of the metal blocking layer BL, and the light is diffracted and scattered by insulating layers disposed around the edge of the metal blocking layer BL, thereby preventing the light from being viewed at the periphery of the metal blocking layer BL.

The transmission area TA may include a first transmission area TA1 defined by being surrounded by the metal blocking layer BL and a second transmission area TA2 defined by being surrounded by the light blocking layer BM, and the planar area of the second transmission area TA2 may be smaller than the planar area of the first transmission area TA1.

In an embodiment, as shown in FIG. 12, the opening OPN of the metal blocking layer BL and the light blocking layer BM is in an approximately cross shape of which the upper protruding portion, the lower protruding portion, the left protruding portion, and the right protruding portion are almost the same as each other in size, but not being limited thereto. Alternatively, the opening OPN of the metal blocking layer BL and the light blocking layer BM may have a planar shape such as a circular shape or an oval shape, as shown in FIG. 6.

Next, referring to FIG. 13 and FIG. 14, together with FIG. 12, a first pixel area PA1 and a second pixel PA2 of a display device according to another alternative embodiment will be described in detail.

Figure 13:
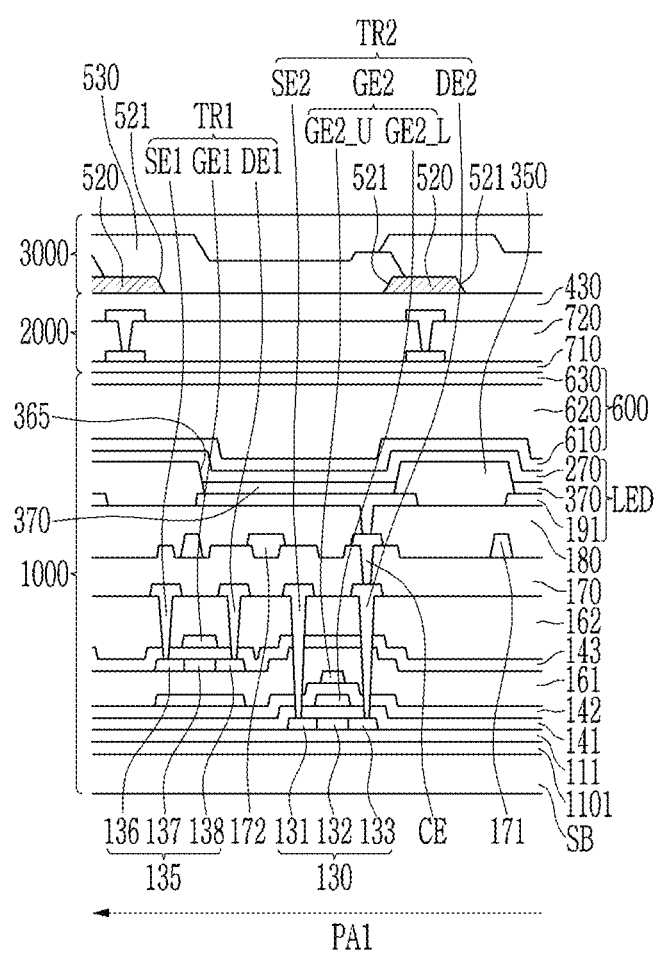
FIG. 13 is a cross-sectional view of a first display area of the display device according to an alternative embodiment.

An embodiment of a first pixel area PA1 of a display device shown in FIG. 13 is similar to the embodiments of the first pixel area PA1 of the display device described above with reference to FIG. 8. Any repetitive detailed description of the same constituent elements will hereinafter be omitted.

Referring to FIG. 13, an embodiment of the first pixel area PA1 of the first display area DA1 of the display device may further include an anti-reflection portion 3000 in addition to a display portion 1000 and a touch portion 2000. The touch portion 2000 may be disposed between the display portion 1000 and the anti-reflection portion 3000.

An interlayer structure of the display portion 1000 and the touch portion 2000 is the same as the constituent elements described above with reference to FIG. 8, and therefore, the anti-reflection portion 3000 will now be mainly described.

In an embodiment, the anti-reflection portion 3000 includes a light blocking layer 520 and a color filter 530. The light blocking layer 520 overlaps a pixel defining layer 350 of the display portion 1000, and may have a narrower width than the pixel defining layer 350. The light blocking layer 520 may be disposed over the entire non-display area NA.

In an embodiment, a plurality of openings 521 that overlap a pixel opening 365 of the pixel defining layer 350 may be defined through the light blocking layer 520, and each opening 521 overlaps the pixel opening 365. A width of each opening 521 of the light blocking layer 520 may be wider than a width of the overlapping pixel opening 365.

The color filter 530 is disposed on the light blocking layer 520, and most of the color filter 530 is disposed at the opening 521 of the light blocking layer 520. A fifth insulation layer 540 may be disposed on the color filter 530. The anti-reflection portion 3000 prevents external light incident from the outside from being recognized by being reflected due to wires and the like. The light blocking layer 520 of the anti-reflection portion 3000 is disposed to overlap a non-display area NA and an edge of a light emission area of a display area DA, and reduces external light incident on the light emission region by absorbing the incident external light. As a result, the degree to which external light is reflected and visually recognized can be reduced.

The color filter 530 of the anti-reflection portion 3000 reduces visual recognition of external light incident from the outside due to reflection after being incident on the pixel defining layer 350 and the like. Since the color filter 530 may not completely block light, visible recognition of the external light may be effectively prevented without reducing efficiency of light emitted from an emission layer 370.

In general, a polarization layer may be used to prevent the visual recognition of reflected light from external light, but such a polarization layer may lower the efficiency of light emitted from the emission layer. However, according to an embodiment, reflection of external light may be prevented from being visually recognized without reducing the efficiency of light emitted from the emission layer 370 through the anti-reflection portion 3000.

Figure 14:
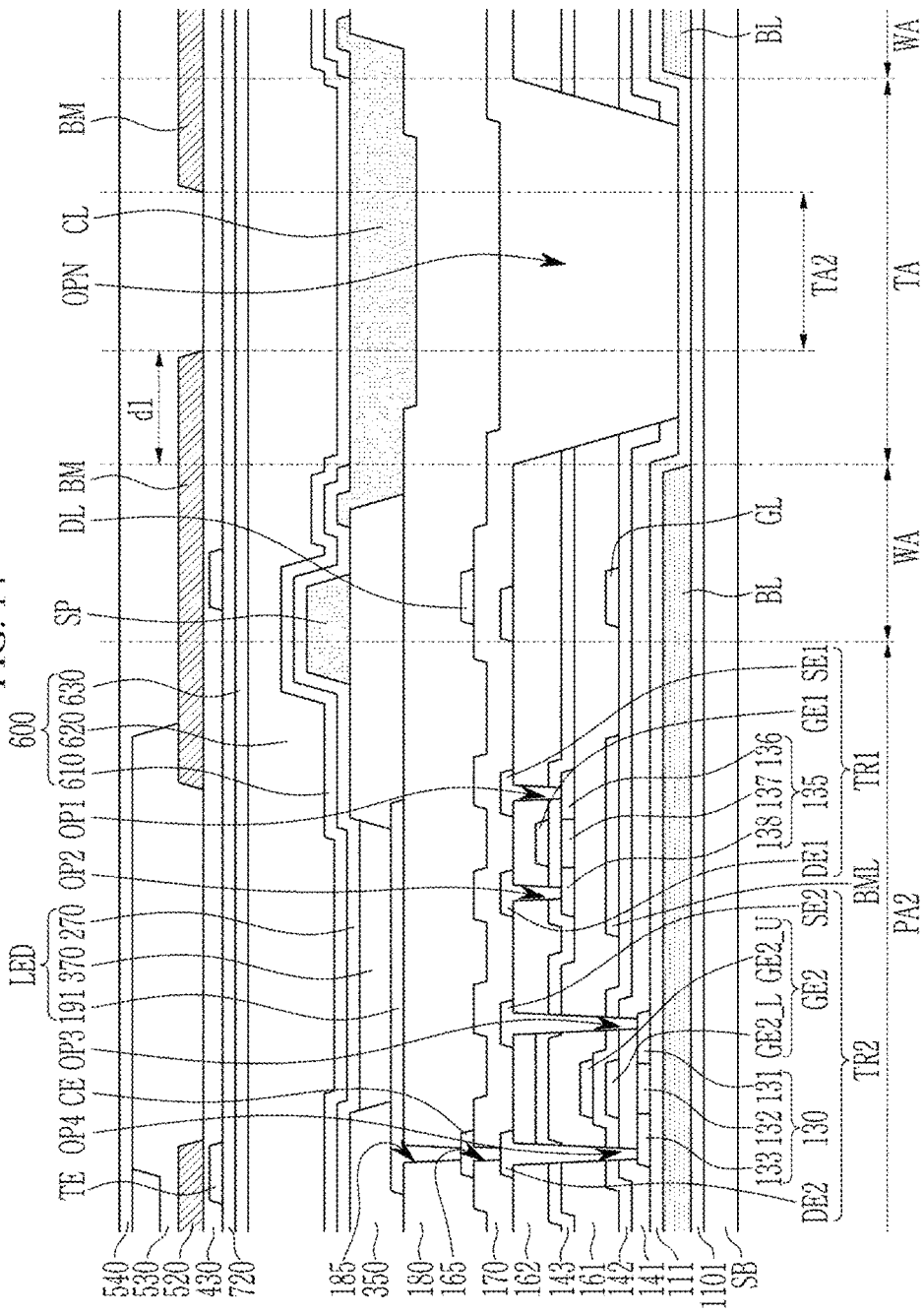
FIG. 14 is a cross-sectional view of a second display area of a display device according to another alternative embodiment.

Next, referring to FIG. 14, an embodiment of the second display area DA2 of the display device includes a second pixel area PA2 where an image is displayed, a transmission area TA, and a wiring area WA disposed at the periphery of the second pixel area PA2.

An interlayer structure of the second pixel area PA2 that displays an image is similar to the interlayer structure of an embodiment of the first pixel area PA1 of the display device described above with reference to FIG. 8. Any repetitive detailed description of the same constituent elements will be omitted.

In an embodiment, as shown in FIG. 14, the transmission area TA of the second display area DA2 of the display device may include a first transmission area TA1 defined by an edge portion of a metal blocking layer BL disposed in the second pixel area PA2, and a second transmission area TA2 defined by an edge portion of a light blocking layer BM disposed in the second pixel area PA2.

In such an embodiment, the second pixel area PA2 of the display device may further include an anti-reflection portion 300 that includes a light blocking layer 520 and a color filter 530, and the light blocking layer BM may be a part of the light blocking layer 520 of the anti-reflection portion 3000.

On a plane, the light blocking layer BM extends more than the edge of the metal blocking layer BL, and thus the area of the second transmission area TA2 may be narrower than the area of the first transmission area TA1, and the area of an opening OPN of the transmission area TA may be almost the same as the area of the second transmission area TA2.

In such an embodiment, as described above, a plurality of insulation layers 141, 142, 143, 161, and 162 disposed in the second pixel area PA2 may be removed in the first transmission area TA1, but the plurality of insulation layers 141, 142, 143, 161, and 162 may be partially disposed at the side surface of the metal blocking layer BL, and due to a difference in thickness and characteristics of the plurality of insulation layers 141, 142, 143, 161, and 162 disposed at the edge of the first transmission area TA1, light may diffracted or scattered by the plurality of insulation layers 141, 142, 143, 161, and 162 at the edge of the first transmission area TA1, and thus may be recognized from the outside, and accordingly the performance of the optical device may be deteriorated.

In an embodiment of the display device according to the invention, on a plane, the edge of the light blocking layer BM protrudes more than the edge of the metal blocking layer BL, and thus the edge of the insulation layers 141, 142, 143, 161, and 162 disposed around the edge of the metal blocking layer BL may be covered thereby, and accordingly, the light may be effectively prevented from being diffracted and scattered around the edge of the blocking layer BL and thus from being visually recognized.

In an embodiment, the first insulation layer 170 and the second insulation layer 180 also remain in the transmission area TA, thereby further flattening layers disposed below an encapsulation layer 600. In such an embodiment, a planarization layer CL may be disposed on the second insulation layer 180 disposed in the transmission area TA. A surface level of the planarization layer CL disposed in the transmission area TA may be almost the same as a surface level of the pixel defining layer 350. The planarization layer CL may contact the side of the pixel defining layer 350, and may contact at least a portion of an upper surface of the pixel defining layer 350. A difference in surface level of the planarization layer CL disposed in the transmission area TA may be about 0.5 μm or less.

The planarization layer CL may be formed together with a spacer SP using a same layer. The planarization layer CL may include a same material as the spacer SP. The planarization layer CL may include an organic material.

In an embodiment, as described above, the planarization layer CL may be disposed on a second insulation layer 180 disposed in the transmission area TA of the display device, and the surface level of the planarization layer CL disposed in the transmission area TA will be approximately the same as the surface level of the pixel defining layer 350 and may be flat.

Thus, in an embodiment of the display device according to the invention, when light passes through the transmission area TA from the optical device, the path of light may be prevented from being changed due to the difference in the height of the surface of the insulation layers disposed in the transmission area TA, and the optical characteristic deterioration of the optical device may be prevented. In such an embodiment, a step of an insulation layer, which may occur under the encapsulation layer 600, is reduced, thereby preventing the occurrence of the step in the encapsulation layer 600 and increasing the sealing effect of the encapsulation layer 600. In such an embodiment, as described above, the planarization layer CL may be formed together with a spacer SP using a same layer, thereby flattening the surface of the insulation layer of the transmission area TA without adding a manufacturing process or increasing manufacturing cost.

Other features of the display device of FIG. 14 are substantially the same as the embodiments of the display device described above.

Figure 15:
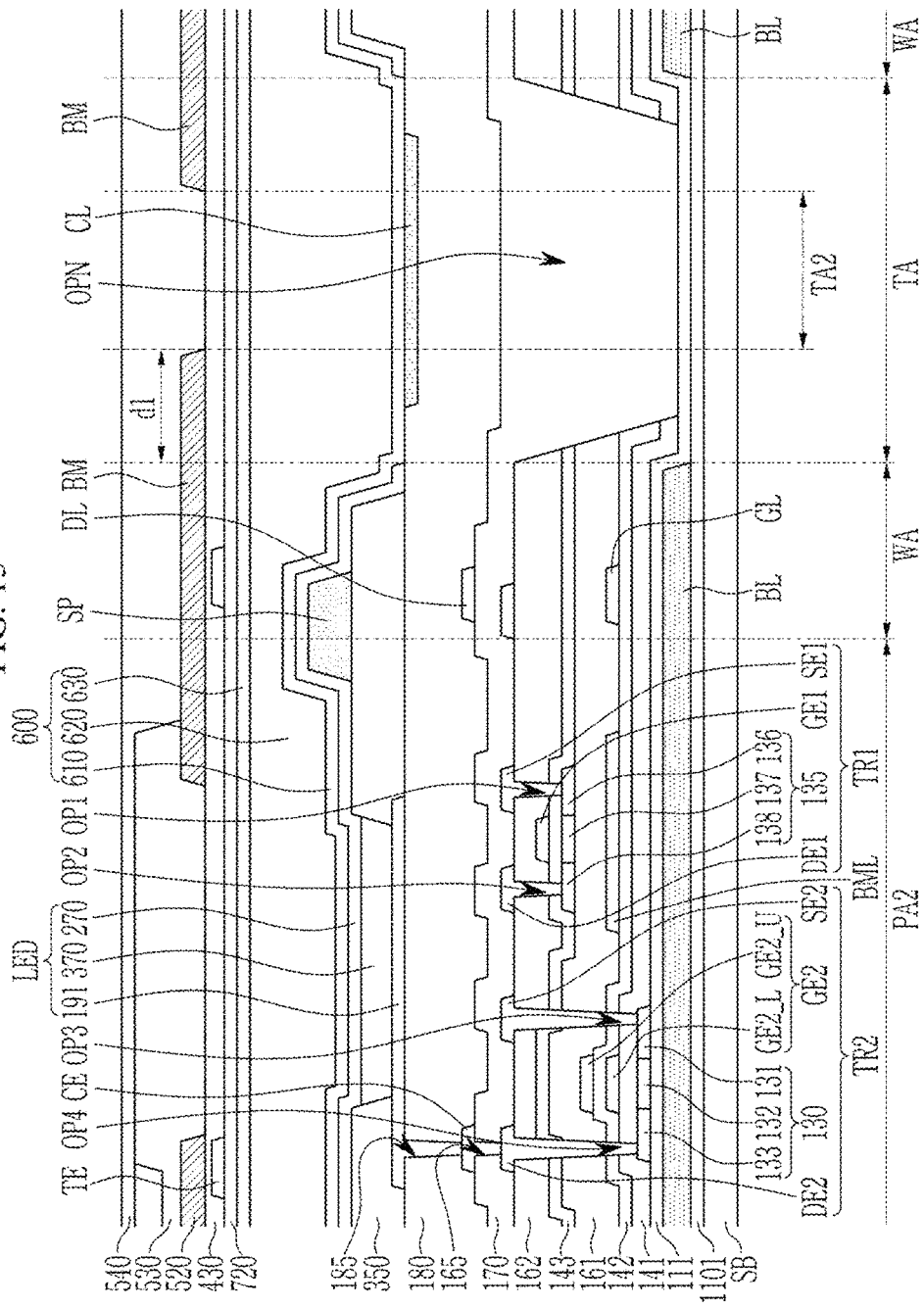
FIG. 15 is a cross-sectional view of a second display area of a display device according to another alternative embodiment.

Next, a second display area of a display device according to a display device according to another alternative embodiment will be described with reference to FIG. 15. FIG. 15 is a cross-sectional view of a second display area of a display device according to another alternative embodiment. An embodiment of the second display area of the display device shown in FIG. 15 is similar to the embodiments of the second display area of the display device described above with reference to FIG. 13 and FIG. 14. Any repetitive detailed description of the same constituent element will be omitted.

Referring to FIG. 15, in an embodiment of the second display area of the display device, a planarization layer CL disposed in a transmission layer TA is disposed to fill a step portion of insulation layers 170 and 180 disposed in the transmission area TA. Thus, the planarization layer CL may not contact the side of the pixel defining layer 350.

In such an embodiment, a surface level of the planarization layer CL may be almost the same as a surface level of the second insulation layer 180, and the planarization layer CL compensates for a step due to insulation layers 141, 142, 143, 161, and 162 removed from the transmission area TA, thereby flattening the surface of the transmission area TA disposed below an encapsulation layer 600. A difference of a surface level of the planarization layer CL disposed in the transmission area TA may be about 0.5 μm or less.

In such an embodiment, as described above, the planarization layer CL may be disposed on the second insulation layer 180 disposed in the transmission area TA of the display device, and the planarization layer CL compensates for the step due to the insulation layers 141, 142, 143, 161, and 162 removed from the transmission area TA such that the surface of the transmission area TA disposed below an encapsulation layer 600 may be flattened.

Thus, in an embodiment of the display device according to the invention, when light passes through the transmission area TA from the optical device, the path of light may be prevented from being changed due to the difference in the height of the surface of the insulation layers disposed in the transmission area TA, and the optical characteristic deterioration of the optical device may be prevented. In such an embodiment, the planarization layer CL reduces the step that may occur under the encapsulation layer 600 disposed in the transmission area TA, thereby preventing the occurrence of the step in the encapsulation layer 600, and increasing the sealing effect of the encapsulation layer 600. In such an embodiment, as described above, the planarization layer CL may be formed together with a spacer SP using a same layer, thereby flattening the surface of the insulation layer of the transmission area TA without adding a manufacturing process or increasing manufacturing cost.

Other features of the embodiment of the display device of FIG. 15 are substantially the same as the embodiments of the display device described above.

Figure 16:
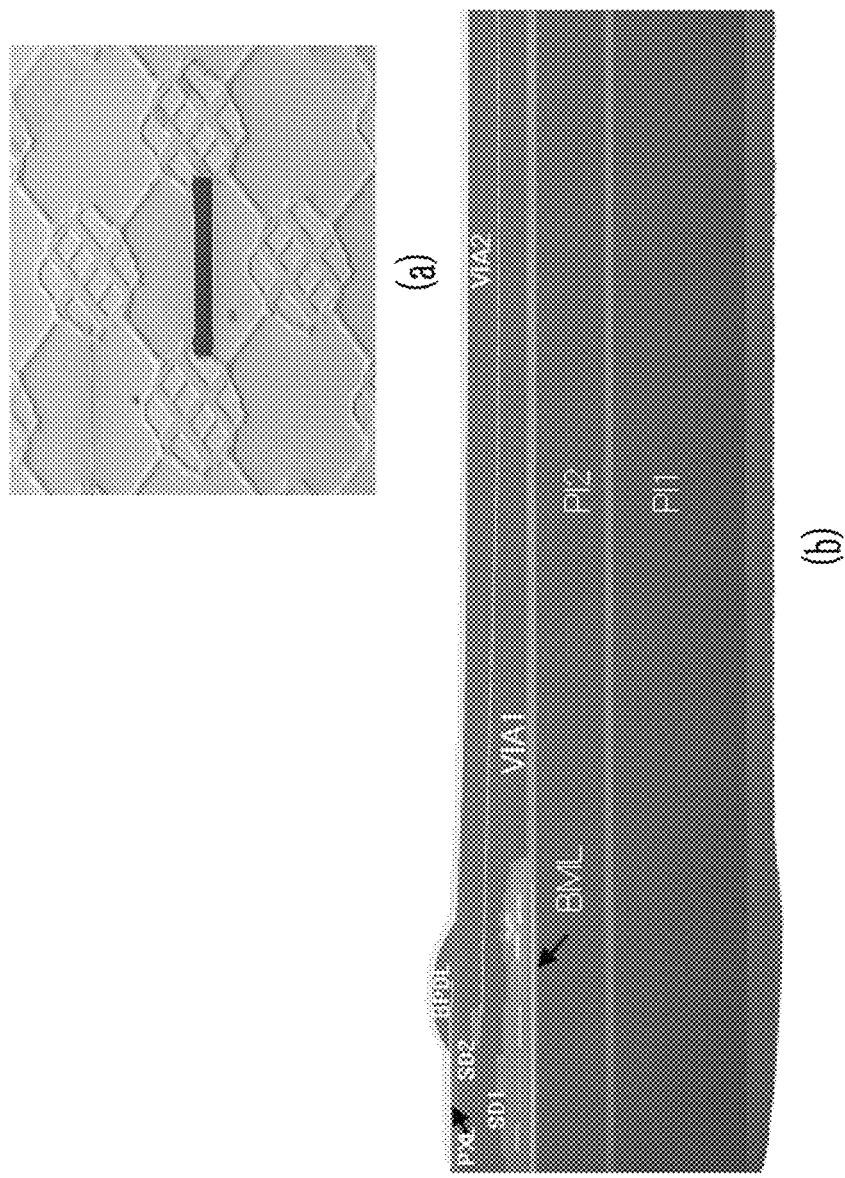
FIG. 16 and FIG. 17 show results of the experimental example.
Figure 17:
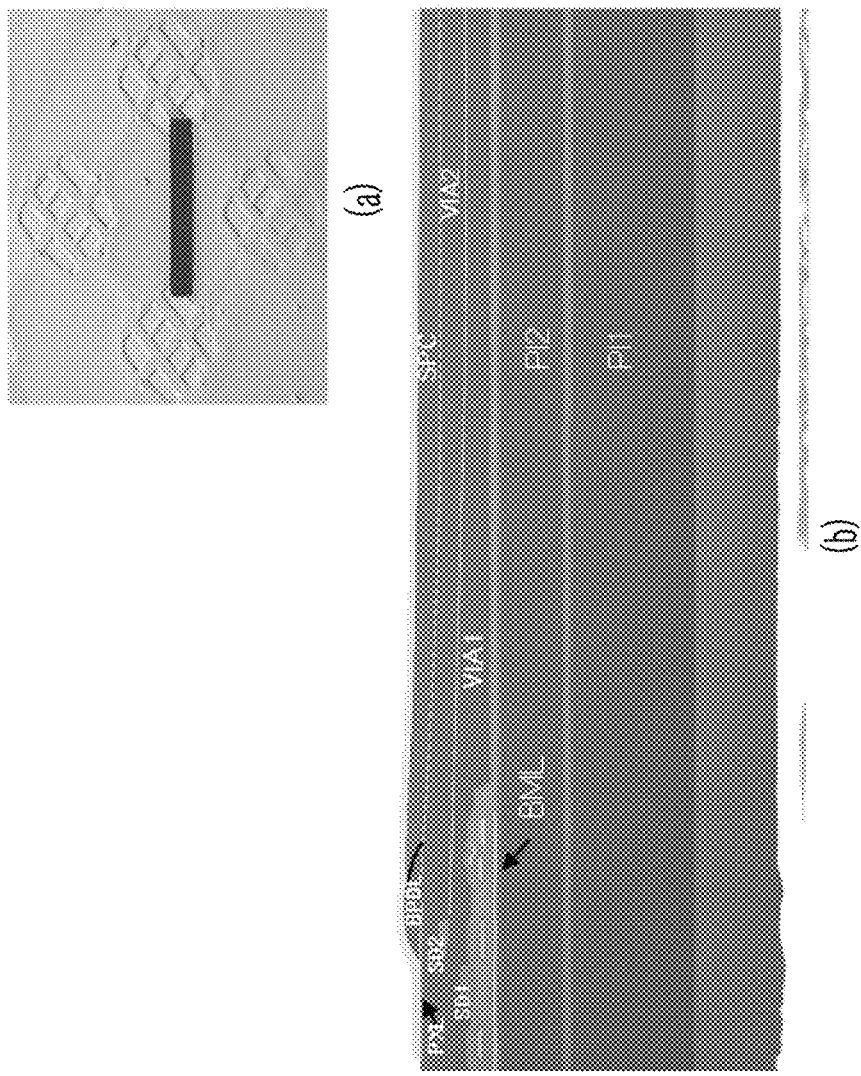

Next, referring to FIG. 16 and FIG. 17, an experimental example will be described. FIG. 16 and FIG. 17 show results of the experimental example.

In the experimental example, an electron microscopic image of a portion of a second display area DA2 is shown in FIG. 16 and FIG. 17 with respect to a first case case1 in which a first insulation layer 170 (VIA1) and a second insulation layer 180 (VIA2) are formed in a transmission area TA, and a second case case2 in which a first insulation layer 170 and a second insulation layer 180 are formed in a transmission area TA and a planarization layer CL (SPC) is formed on the second insulation layer 180 as in the display device according to an embodiment. In both of the first case case1 and the second case case2, other conditions are the same as each other, excluding forming of the planarization layer CL.

FIG. 16 shows a result of the first case case1, and FIG. 17 shows a result of the second case case2. In FIG. 16 and FIG. 17, (a) is a surface photo of the second display area DA2, and (b) is a photo of a cross-section of the second display area DA2.

Referring to FIG. 16 and FIG. 17, a surface was the transmission area TA was more flattened in the second case case2 where the first insulation layer 170 and the second insulation layer 180 are formed in the transmission area TA, and then the planarization layer CL is formed on the second insulation layer 180 as in the display device according to an embodiment, compared to the first case case1 where the first insulation layer 170 and the second insulation layer 180 are formed in the transmission area TA.

Figure 18:
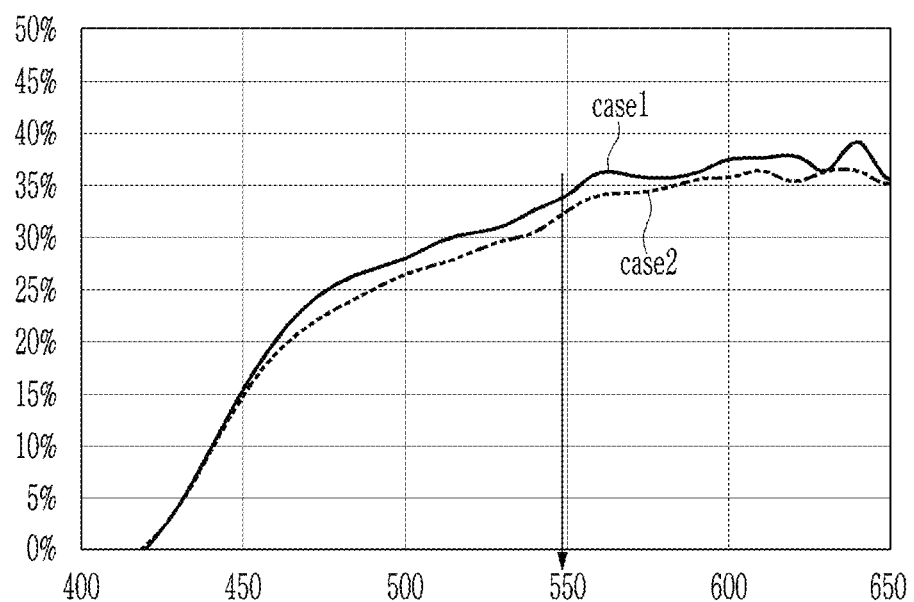
FIG. 18 is a graph illustrating a result of another experimental example.

Next, referring to FIG. 18, another experimental example will be described. FIG. 18 is a graph illustrating a result of another experimental example.

In the experimental example, transmittance according to a wavelength of light was measured with respect to a first case case1 in which a first insulation layer 170 and a second insulation layer 180 are formed in a transmission area TA, and a second case case2 in which a first insulation layer 170 and a second insulation layer 180 are formed in a transmission area TA and a planarization layer CL is formed on the second insulation layer 180 as in the display device according to an embodiment, and the results are shown in FIG. 18. In both of the first case case1 and the second case case2, other conditions are the same as each other, excluding forming of the planarization layer CL.

Referring to FIG. 18, transmittance was not deteriorated in the second case case2 where the first insulation layer 170 and the second insulation layer 180 are formed in the transmission area TA, and then the planarization layer CL is formed on the second insulation layer 180 as in the display device according to an embodiment, compared to the first case case1 where the first insulation layer 170 and the second insulation layer 180 are formed in the transmission area TA.

As described, in the second case case2 where the first insulation layer 170 and the second insulation layer 180 are formed in the transmission area TA, and the planarization layer CL is formed on the second insulation layer 180, as in the display device according to an embodiment, the surface may be flattened without reducing the transmittance of the transmission area TA.

Figure 19:
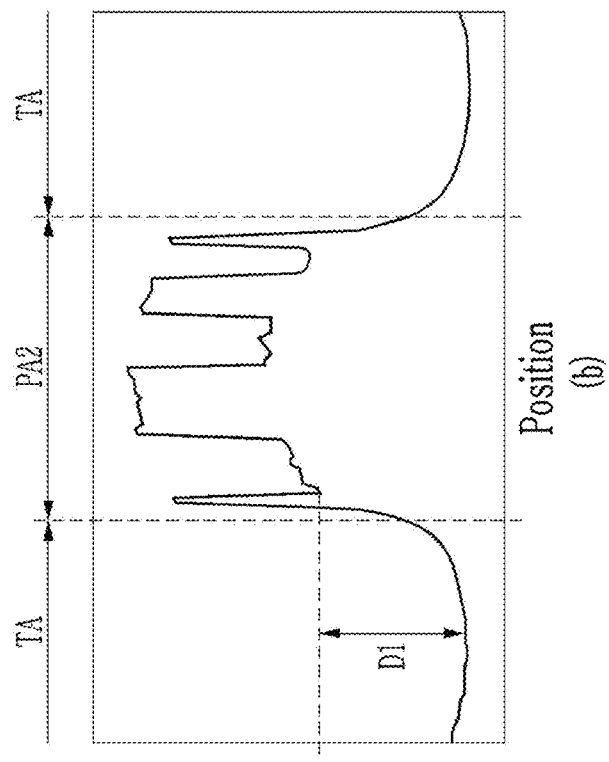
FIG. 19 and FIG. 20 show results of another experimental example.
Figure 19:
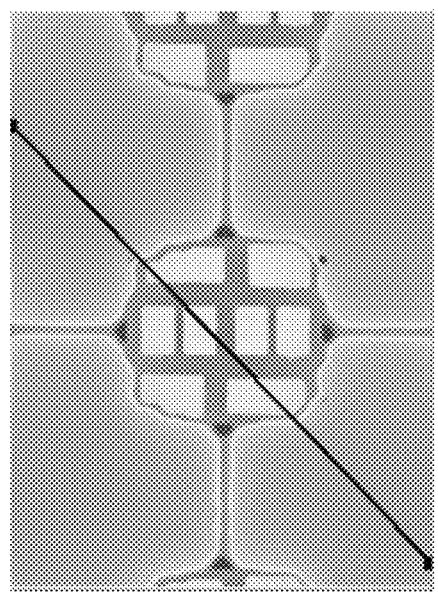
Figure 20:
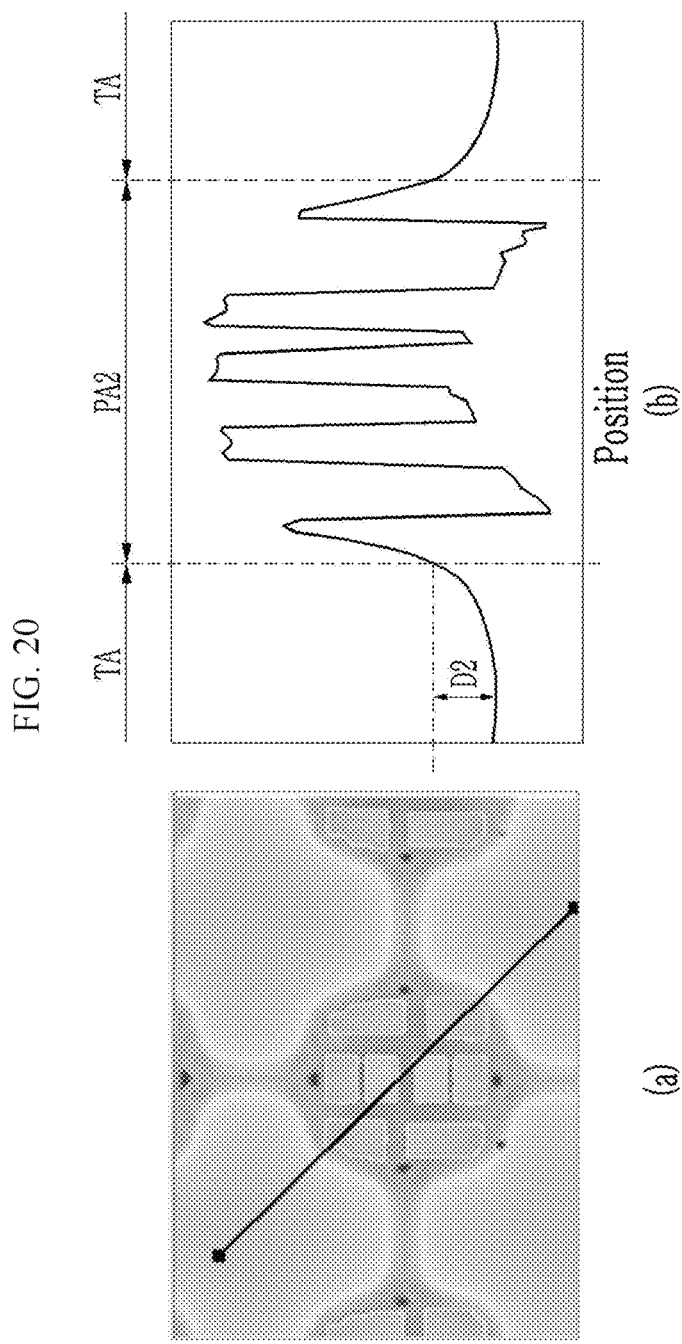

Next, referring to FIG. 19 and FIG. 20, another experimental example will be described. FIG. 19 and FIG. 20 show results of another experimental example.

In the experimental example, a surface step of a second display area DA2 was measured with respect to a first case case1 in which a first insulation layer 170 and a second insulation layer 180 are formed in a transmission area TA, and a second case case2 in which a first insulation layer 170 and a second insulation layer 180 are formed in a transmission area TA and a planarization layer CL is formed on the second insulation layer 180 as in the display device according to an embodiment, and results are shown in FIG. 19 and FIG. 20. In both of the first case case1 and the second case case2, other conditions are the same, excluding forming of the planarization layer CL.

FIG. 19 shows a result of the first case case1, and FIG. 20 shows a result of the second case case2. In FIG. 19 and FIG. 20, (a) is a surface photo of the second display area DA2, and (b) is a graph with respect to a surface height of the second display area DA2.

Referring to FIG. 19 and FIG. 20, as in the display device according to an embodiment, it was shown that a surface step D2 of the transmission area TA in the second case case2 was significantly reduced compared to the surface step D1 of the transmission area TA in the first case case1, and accordingly, the surface of the transmission area TA was more flat in the second case case2 in which the first insulation layer 170 and the second insulation layer 180 are formed in the transmission area TA and the planarization layer CL is formed on the second insulation layer 180 as in the display device according to an embodiment.

Next, referring to Table 1 below, another experimental example will be described. In the experimental example, a modulation transfer function ("MTF") of an optical device was measured with respect to a first case case1 in which a first insulation layer 170 and a second insulation layer 180 are formed in a transmission area TA, a second case case2 in which the first insulation layer 170 and the second insulation layer 180 are formed in the transmission layer TA, and the planarization layer CL is formed on the second insulation layer 180 as in the display device according to an embodiment, while forming the planarization layer CL with a relatively thin thickness, and a third case case3 in which the first insulation layer 170 and the second insulation layer 180 are formed in the transmission area TA and the planarization layer CL is formed on the second insulation layer 180 as in the display device according to an embodiment, while forming the planarization layer CL with a relatively thick thickness, and results are shown in Table 1. The MTF of the optical device was measured in three areas, that is, an edge portion EP, a center portion CP, and a middle portion MP of the edge portion and the center portion of the transmission area TA.

TABLE 1

| Case | Position | MTF (110 lp/mm) | MTF (<100 lp/mm) |
| --- | --- | --- | --- |
| case1 | EP | 12.1 | 13.6 |
|  | MP | 18.7 | 14.4 |
|  | CP | 10.5 | 7.4 |
| case2 | EP | 38.1 | 34.8 |
|  | MP | 54.4 | 41.0 |
|  | CP | 58.7 | 43.3 |
| case3 | EP | 60.6 | 44.5 |
|  | MP | 59.4 | 43.3 |
|  | CP | 57.3 | 41.9 |

Referring to Table 1, the second case case2 and the third case case3, in which the first insulation layer 170 and the second insulation layer 180 are formed in the transmission area TA and the planarization layer CL is formed on the second insulation layer 180 as in the display device according to an embodiment, showed that MTF values of the optical devices were high compared to the first case case1 in which the first insulation layer 170 and the second insulation layer 180 are formed in the transmission area TA, and accordingly, the optical characteristics of the optical devices were relatively improved. In addition, among the second case case2 and the third case case3 in which the first insulation layer 170 and the second insulation layer 180 are formed in the transmission area TA and the planarization layer CL is formed on the second insulation layer 180 as in the display device according to an embodiment, the MTF value of the optical device was high in the third case case3 in which the thickness of the planarization layer CL is relatively thick compared to the second case case2 in which the thickness of the planarization layer CL is relatively thin, and accordingly, the optical characteristics of the optical device was relatively improved in the third case case3.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate on which a display area and a transmission area are defined;
a metal blocking layer disposed in the display area on the substrate;
an inorganic insulation layer disposed on the metal blocking layer;
an organic insulation layer disposed on the inorganic insulation layer;
a pixel defining layer disposed on the organic insulation layer, wherein an opening is defined through the pixel defining layer;
an emission layer disposed on the organic insulation layer and in the opening of the pixel defining layer;
a planarization layer disposed in the transmission area on the organic insulation layer; and
an encapsulation layer disposed in the display area and the transmission area,
wherein the inorganic insulation layer is at least partially removed in the transmission area,
the organic insulation layer is disposed in the display area and the transmission area, and
the planarization layer contacts a side surface of the pixel defining layer.

2. The display device of claim 1, further comprising:
a spacer disposed on the pixel defining layer,
wherein the planarization layer is defined by a same layer as the spacer.

3. The display device of claim 1, further comprising:
a spacer disposed on the pixel defining layer,
wherein the organic insulation layer includes a step portion disposed in the transmission area,
the planarization layer is disposed in the step portion, and
the planarization layer is defined by a same layer as the spacer.

4. The display device of claim 1, wherein
a difference in surface level of the planarization layer disposed below the encapsulation layer of the transmission area is about 0.5 µm or less.

5. The display device of claim 1, further comprising:
a light blocking layer and a color filter, which are disposed on the emission layer of the display area,
wherein an edge of the light blocking layer protrudes toward the transmission area more than an edge of the metal blocking layer.

6. The display device of claim 5, wherein
a first opening is defined through the metal blocking layer to overlap the transmission area,
a second opening is defined through the light blocking layer to overlap the transmission area, and
a planar area of the second opening is smaller than a planar area of the first opening.

7. The display device of claim 6, wherein a planar shape of the first opening and a planar shape of the second opening are substantially the same as each other.

8. The display device of claim 5, further comprising:
a spacer disposed on the pixel defining layer,
wherein the planarization layer is defined by a same layer as the spacer.

9. The display device of claim 5, further comprising:
a spacer disposed on the pixel defining layer,
wherein the organic insulation layer includes a step portion disposed in the transmission area,
the planarization layer is disposed in the step portion, and
the planarization layer is defined by a same layer as the spacer.

10. The display device of claim 5, wherein a difference in surface height of the planarization layer disposed below the encapsulation layer of the transmission area is about 0.5 μm or less.

11. A display device comprising:
a first display area including a first pixel area;
a second display area including a second pixel area and a transmission area which neighbor each other;
an optical device which overlaps the second display area;
a metal blocking layer disposed in the second pixel area;
an inorganic insulation layer disposed in the first pixel area, the second pixel area, and an edge of the transmission area;
an organic insulation layer disposed in the first display area and the second display area;
a pixel defining layer disposed on the organic insulation layer;
a planarization layer disposed in the transmission area on the organic insulation layer; and
an encapsulation layer disposed in the first display area and the second display area,
wherein the inorganic insulation layer covers an edge of the metal blocking layer, and
the planarization layer contacts a side surface of the pixel defining layer.

12. The display device of claim 11, further comprising:
a spacer disposed on the pixel defining layer,
wherein the planarization layer is defined by a same layer as the spacer.

13. The display device of claim 12, wherein a difference in surface height of the planarization layer disposed below the encapsulation layer of the transmission area is about 0.5 μm or less.

14. The display device of claim 12, wherein
the organic insulation layer includes a step portion disposed in the transmission area, and
the planarization layer is disposed in the step portion.

15. The display device of claim 11, further comprising:
an emission layer disposed in the first pixel area and the second pixel area; and
a light blocking layer and a color filter which are disposed on the emission layer,
wherein an edge of the light blocking layer protrudes toward the transmission area more than an edge of the metal blocking layer.

16. The display device of claim 15, wherein the light blocking layer and the color filter are disposed on the encapsulation layer.

17. The display device of claim 15, wherein
a first opening is defined through the metal blocking layer to overlap the transmission area,
a second opening is defined through the light blocking layer to overlap the transmission area, and
a planar area of the second opening is smaller than a planar area of the first opening.

18. The display device of claim 17, wherein a planar shape of the first opening and a planar shape of the second opening are substantially to the same as each other.

19. The display device of claim 15, further comprising:
a spacer disposed on the pixel defining layer,
wherein the planarization layer is defined by a same layer as the spacer.

20. The display device of claim 15, further comprising:
a spacer disposed on the pixel defining layer,
wherein the organic insulation layer includes a step portion disposed in the transmission area,
the planarization layer is disposed in the step portion, and
the planarization layer is defined by a same layer as the spacer.

* * * * *